(12) United States Patent
Chandolu et al.

(10) Patent No.: US 11,723,196 B2
(45) Date of Patent: Aug. 8, 2023

(54) MICROELECTRONIC DEVICES WITH SUPPORT PILLARS SPACED ALONG A SLIT REGION BETWEEN PILLAR ARRAY BLOCKS, AND RELATED SYSTEMS

(71) Applicant: Micron Technology, Inc., Boise, ID (US)

(72) Inventors: Anilkumar Chandolu, Boise, ID (US); Indra V. Chary, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 163 days.

(21) Appl. No.: 17/063,101

(22) Filed: Oct. 5, 2020

(65) Prior Publication Data

US 2022/0108998 A1   Apr. 7, 2022

(51) Int. Cl.
| H01L 27/11582 | (2017.01) |
| H10B 41/27 | (2023.01) |
| H10B 41/10 | (2023.01) |
| H10B 41/35 | (2023.01) |
| H10B 43/10 | (2023.01) |
| H10B 43/27 | (2023.01) |
| H10B 43/35 | (2023.01) |

(52) U.S. Cl.
CPC ............ *H10B 41/27* (2023.02); *H10B 41/10* (2023.02); *H10B 41/35* (2023.02); *H10B 43/10* (2023.02); *H10B 43/27* (2023.02); *H10B 43/35* (2023.02)

(58) Field of Classification Search
CPC ...................... H01L 27/11578; H01L 27/11582
See application file for complete search history.

(56) References Cited

U.S. PATENT DOCUMENTS

| 6,969,866 | B1 | 11/2005 | Lowrey et al. |
| 7,473,574 | B2 | 1/2009 | Kostylev et al. |
| 8,089,059 | B2 | 1/2012 | Klersy |
| 9,659,949 | B2 | 5/2017 | Zhu et al. |
| 10,269,819 | B2 | 4/2019 | Zhu et al. |
| 10,546,862 | B1 | 1/2020 | Yang et al. |
| 10,622,558 | B2 | 4/2020 | Fratin et al. |
| 2006/0110846 | A1 | 5/2006 | Lowrey et al. |
| 2009/0057645 | A1 | 3/2009 | Kostylev et al. |
| 2016/0268263 | A1 | 9/2016 | Lee et al. |

(Continued)

FOREIGN PATENT DOCUMENTS

KR   10-2015-0079495 A   7/2015

OTHER PUBLICATIONS

International Search Report for Application No. PCT/US2021/053326, dated Jan. 27, 2022, 3 pages.

(Continued)

*Primary Examiner* — Christopher A Johnson
(74) *Attorney, Agent, or Firm* — TraskBritt

(57) ABSTRACT

A microelectronic device includes a stack structure comprising a vertically alternating sequence of insulative structures and conductive structures arranged in tiers. At least one slit region divides the stack structure into blocks. Each block comprises an array of active pillars. Along the at least one slit region is a horizontally alternating sequence of slit structure segments and support pillar structures. The slit structure segments and the support pillar structures each extend vertically through the stack structure. Additional microelectronic devices are also disclosed as are related methods and electronic systems.

13 Claims, 18 Drawing Sheets

(56) References Cited

U.S. PATENT DOCUMENTS

| | | | |
|---|---|---|---|
| 2017/0077108 A1 | 3/2017 | Kawaguchi et al. | |
| 2017/0162591 A1 | 6/2017 | Choi | |
| 2019/0229126 A1 | 7/2019 | Zhu et al. | |
| 2020/0035702 A1 | 1/2020 | Lee et al. | |
| 2020/0161187 A1 | 5/2020 | Chandolu et al. | |
| 2020/0395373 A1 | 12/2020 | Huo et al. | |
| 2021/0050358 A1* | 2/2021 | Xu | H01L 27/11565 |
| 2021/0118899 A1 | 4/2021 | King | |
| 2021/0225862 A1* | 7/2021 | Zhang | H01L 27/11565 |
| 2022/0077167 A1* | 3/2022 | Lim | H01L 27/11556 |
| 2022/0085057 A1* | 3/2022 | Jang | H01L 27/11519 |
| 2022/0328413 A1* | 10/2022 | Kubo | H01L 23/535 |

OTHER PUBLICATIONS

Written Opinion of the International Searching Authority for Application No. PCT/US2021/053326, dated Jan. 27, 2022, 5 pages.

* cited by examiner

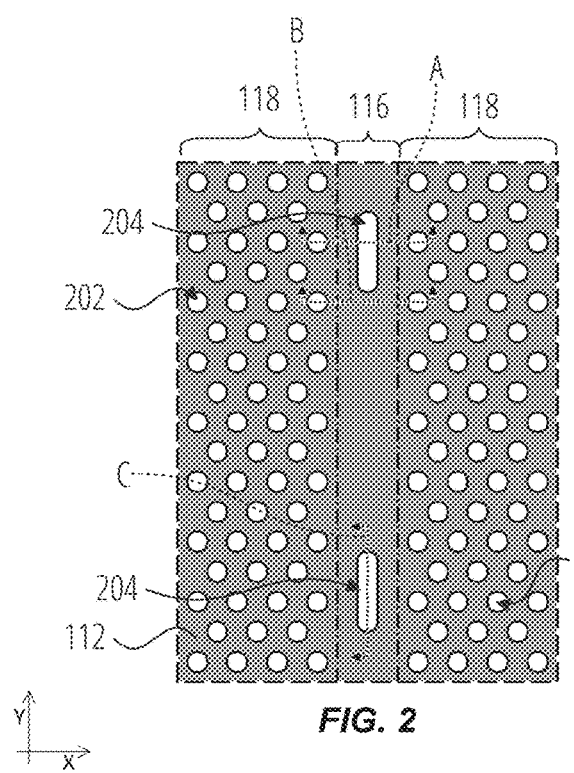
FIG. 2
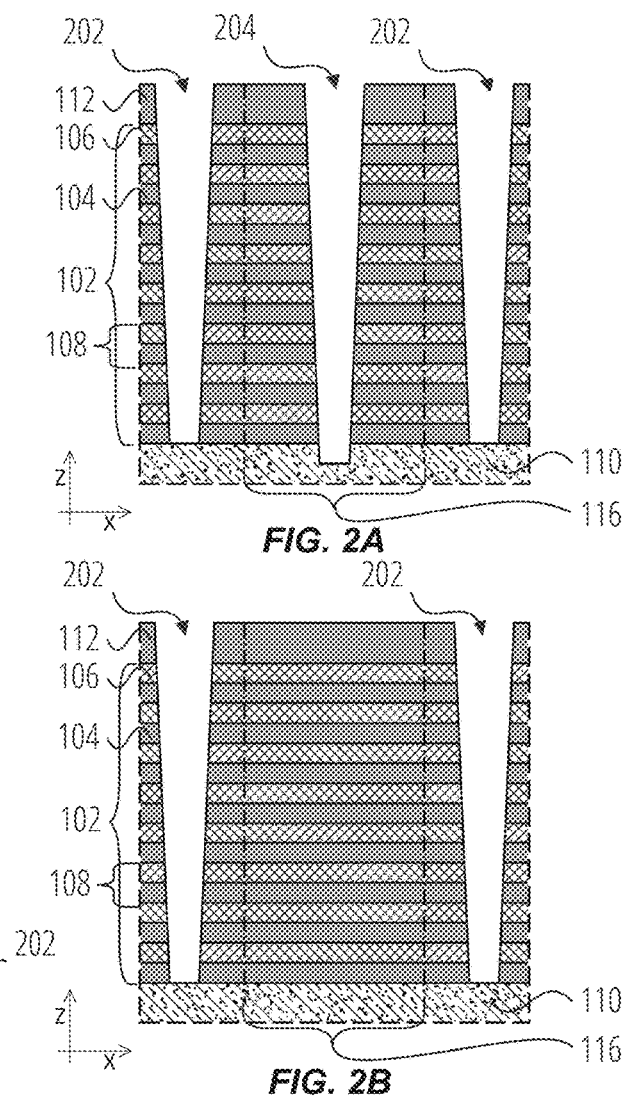
FIG. 2A
FIG. 2B
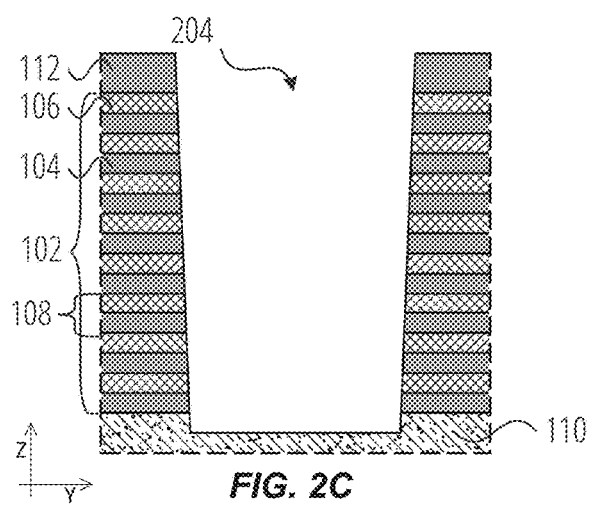
FIG. 2C

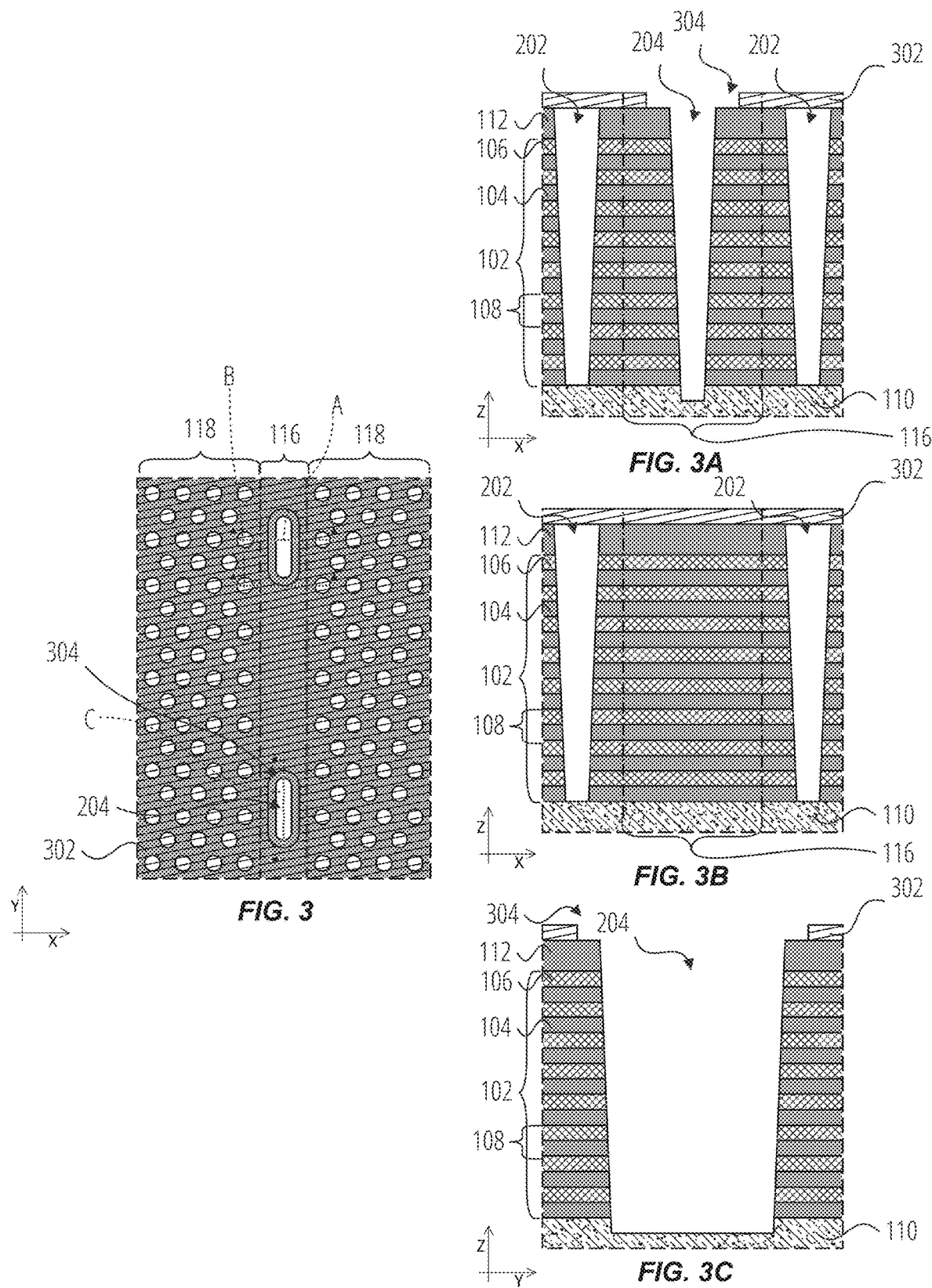

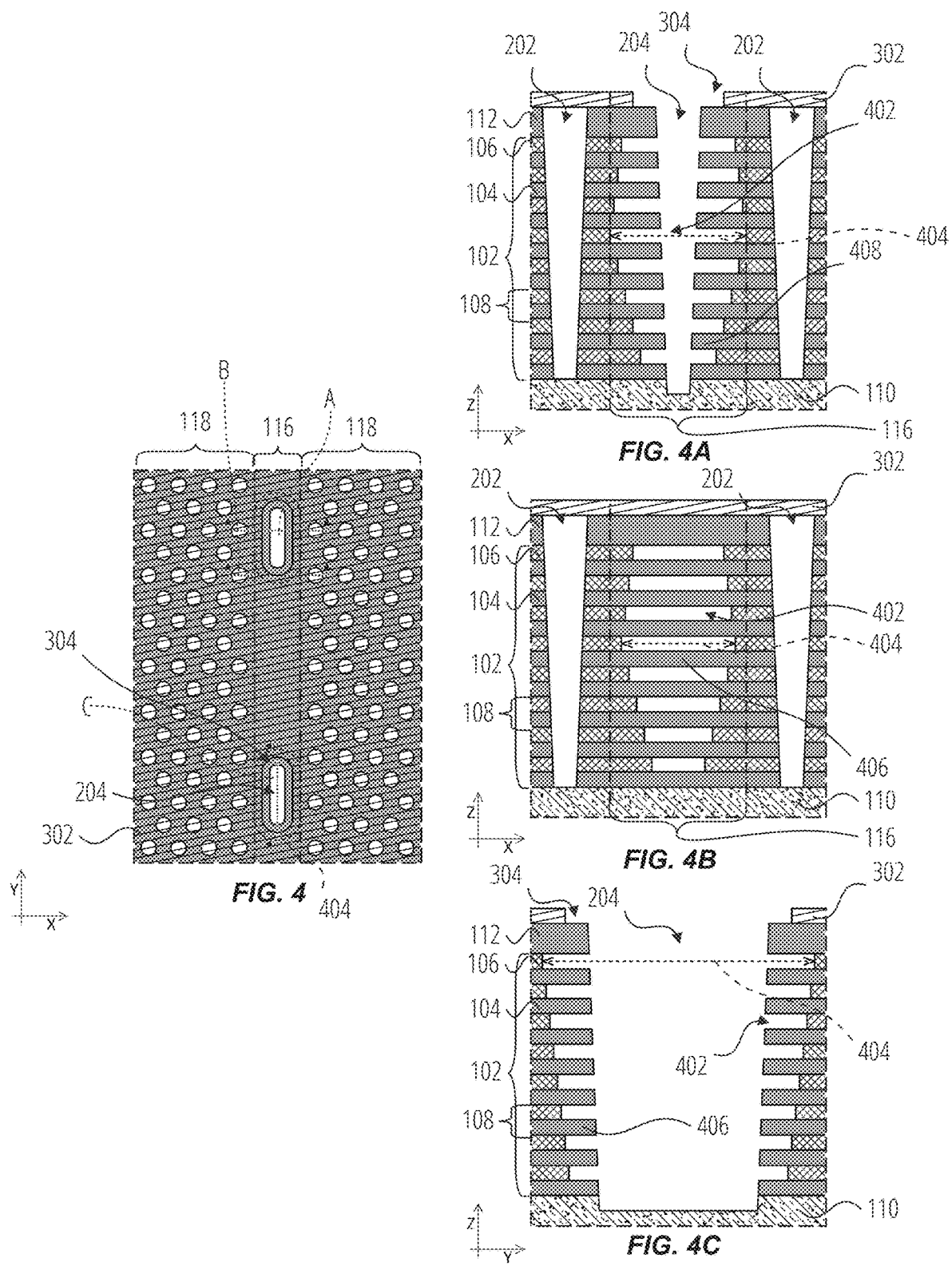

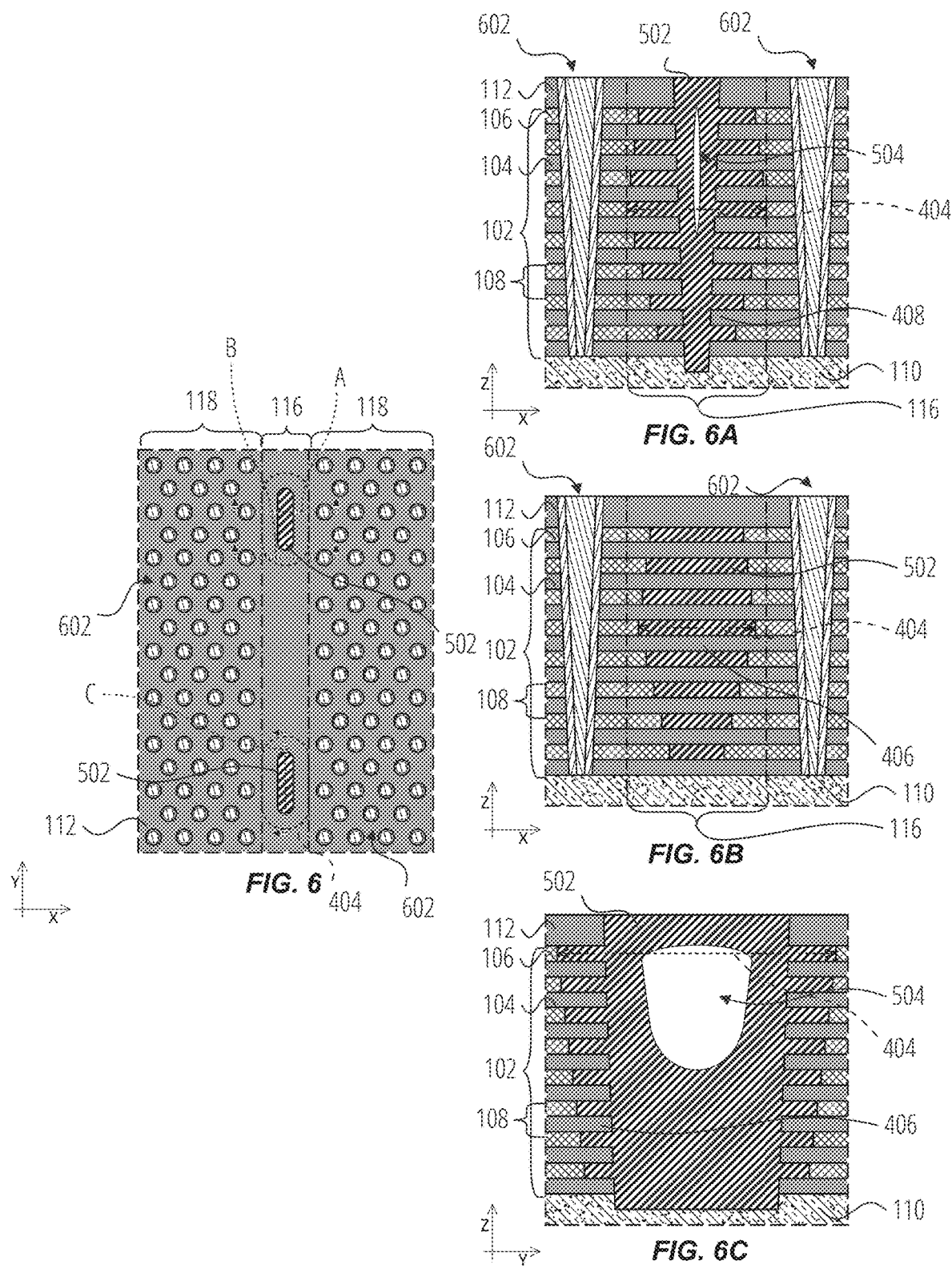

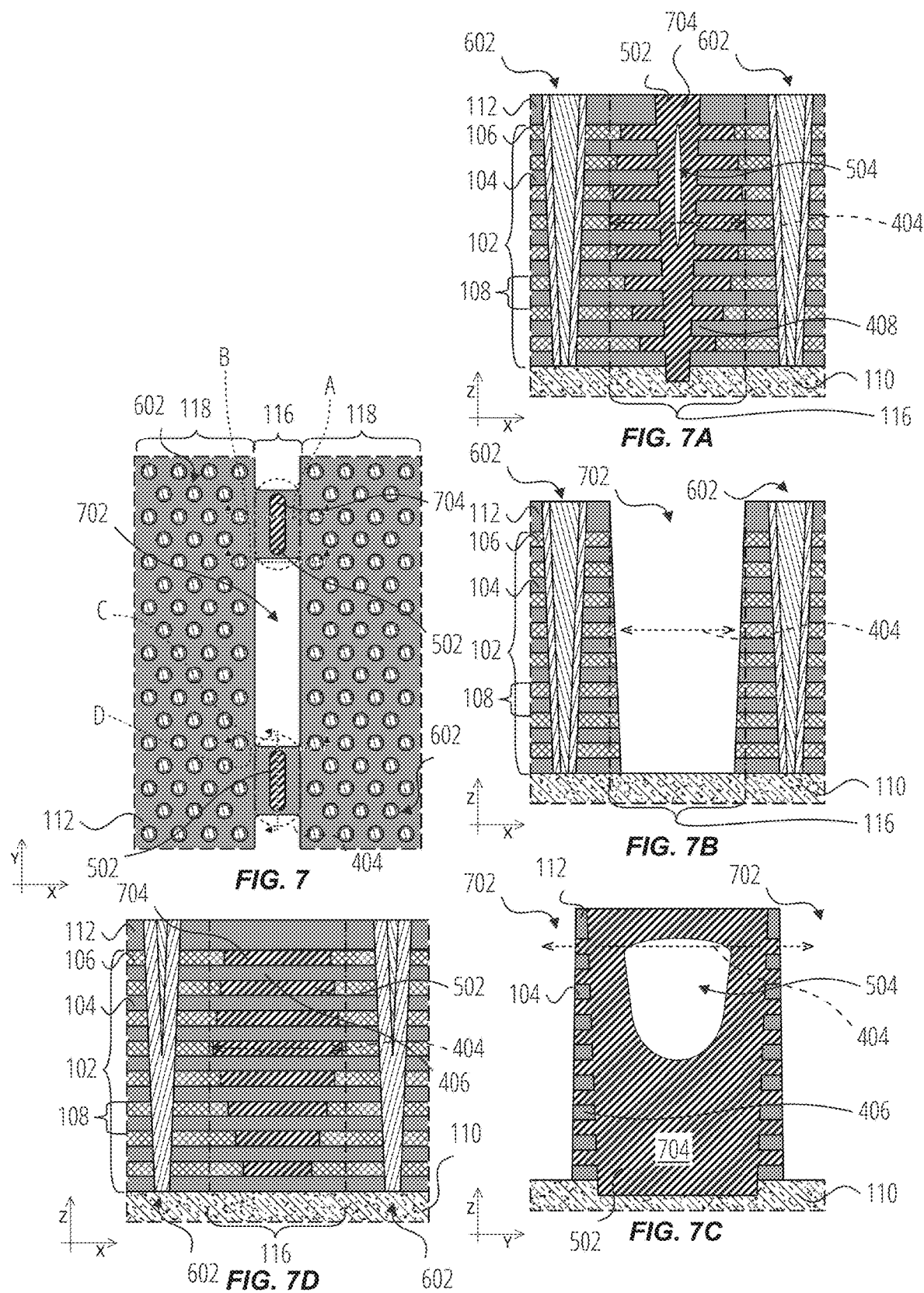

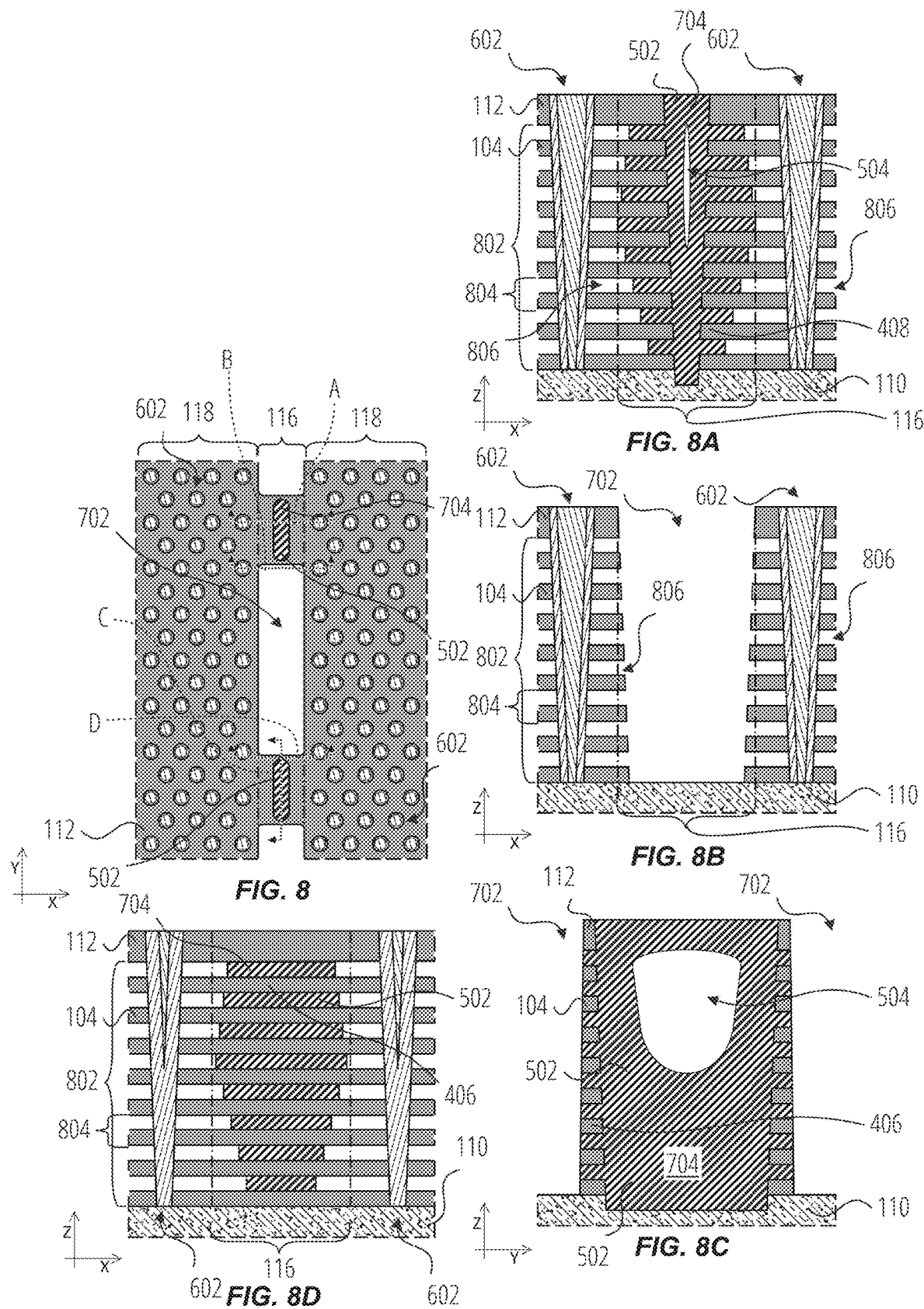

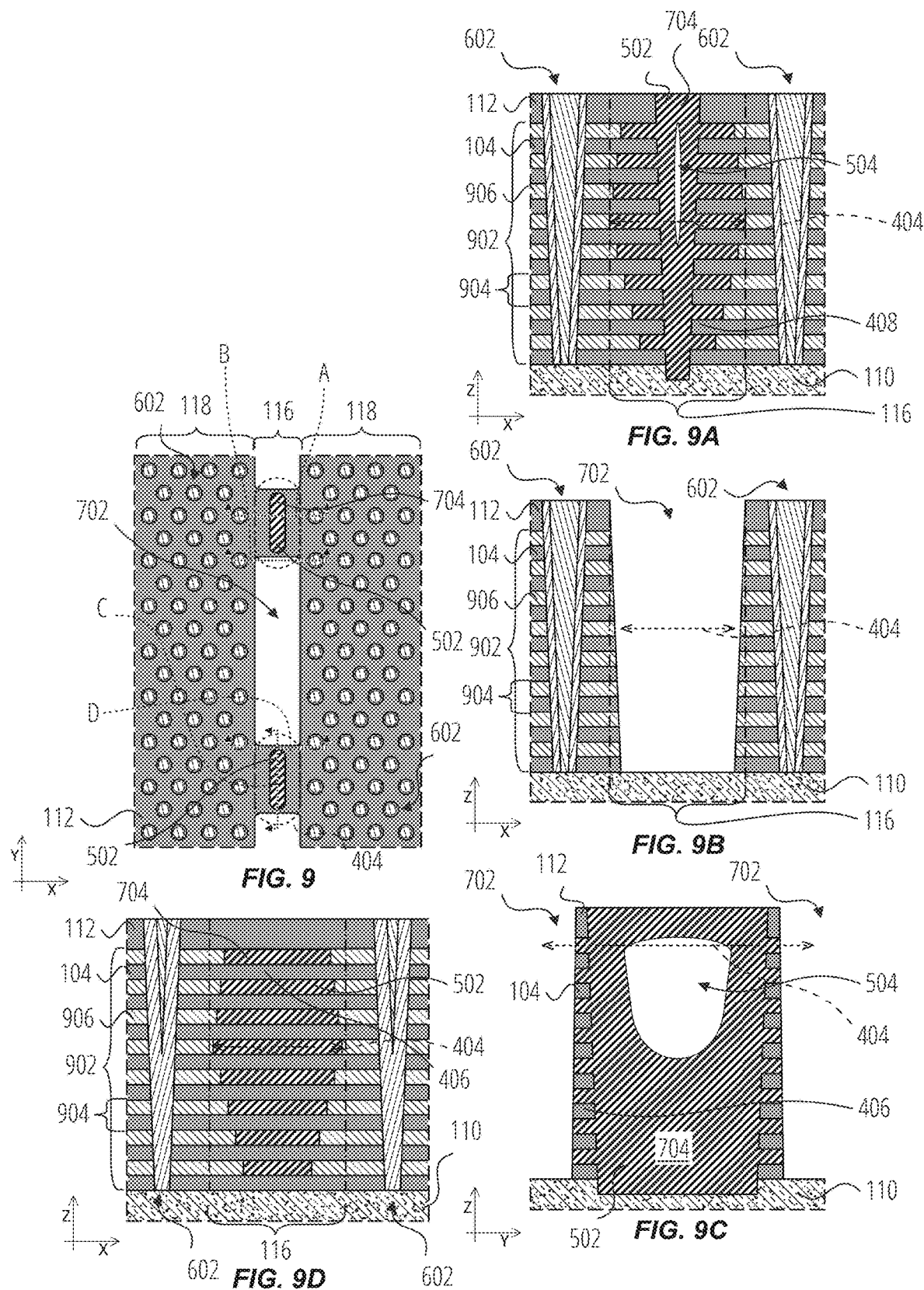

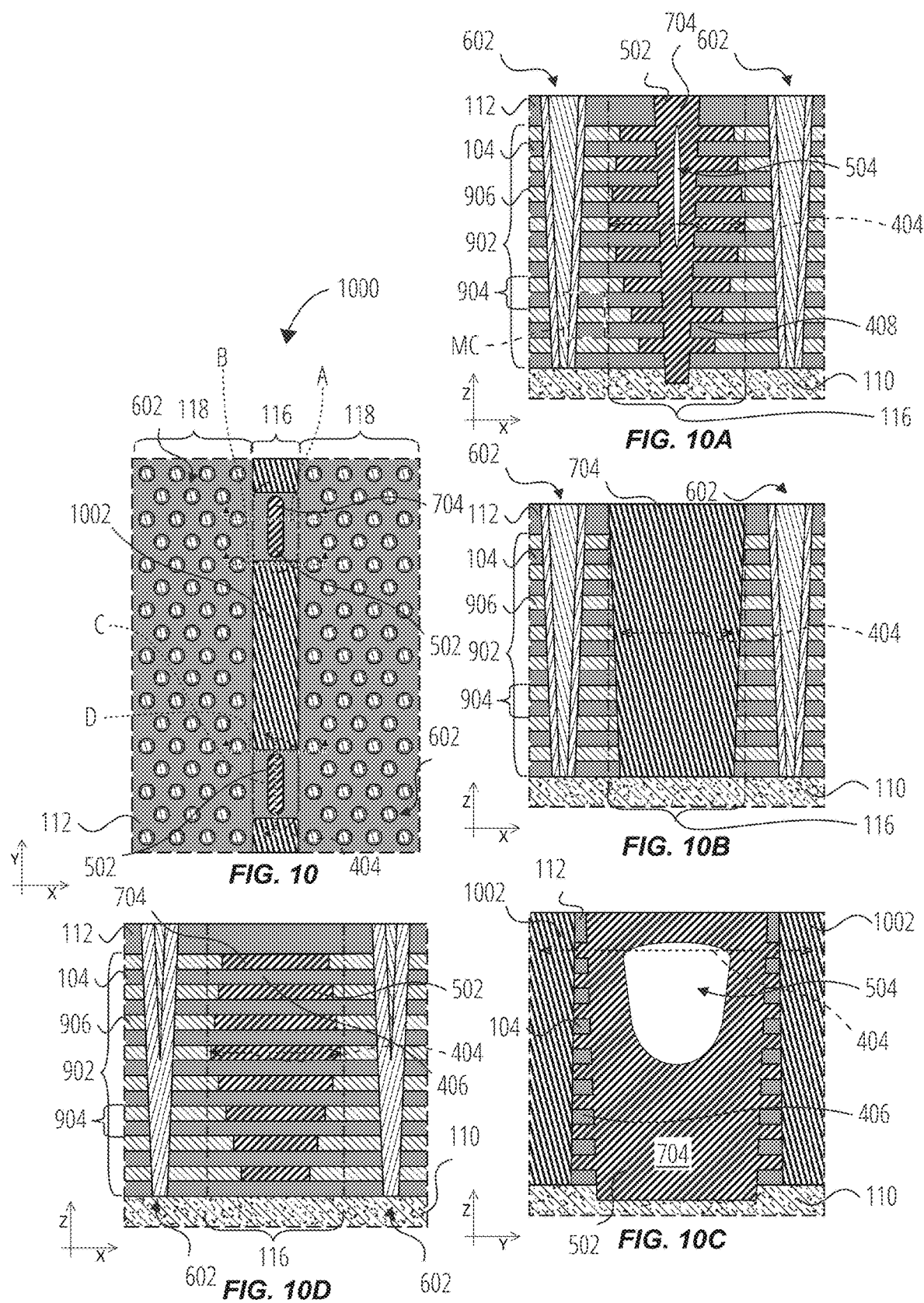

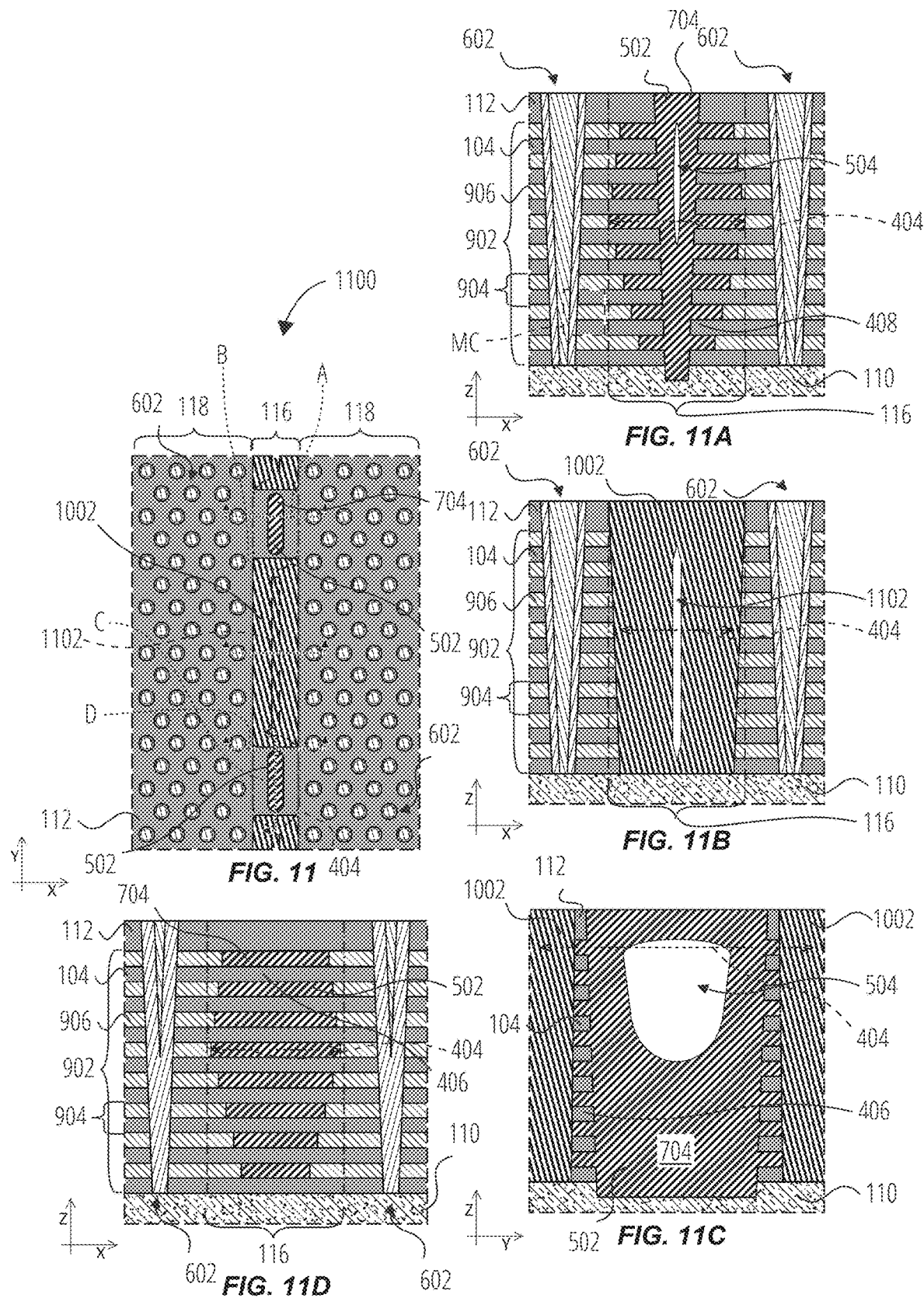

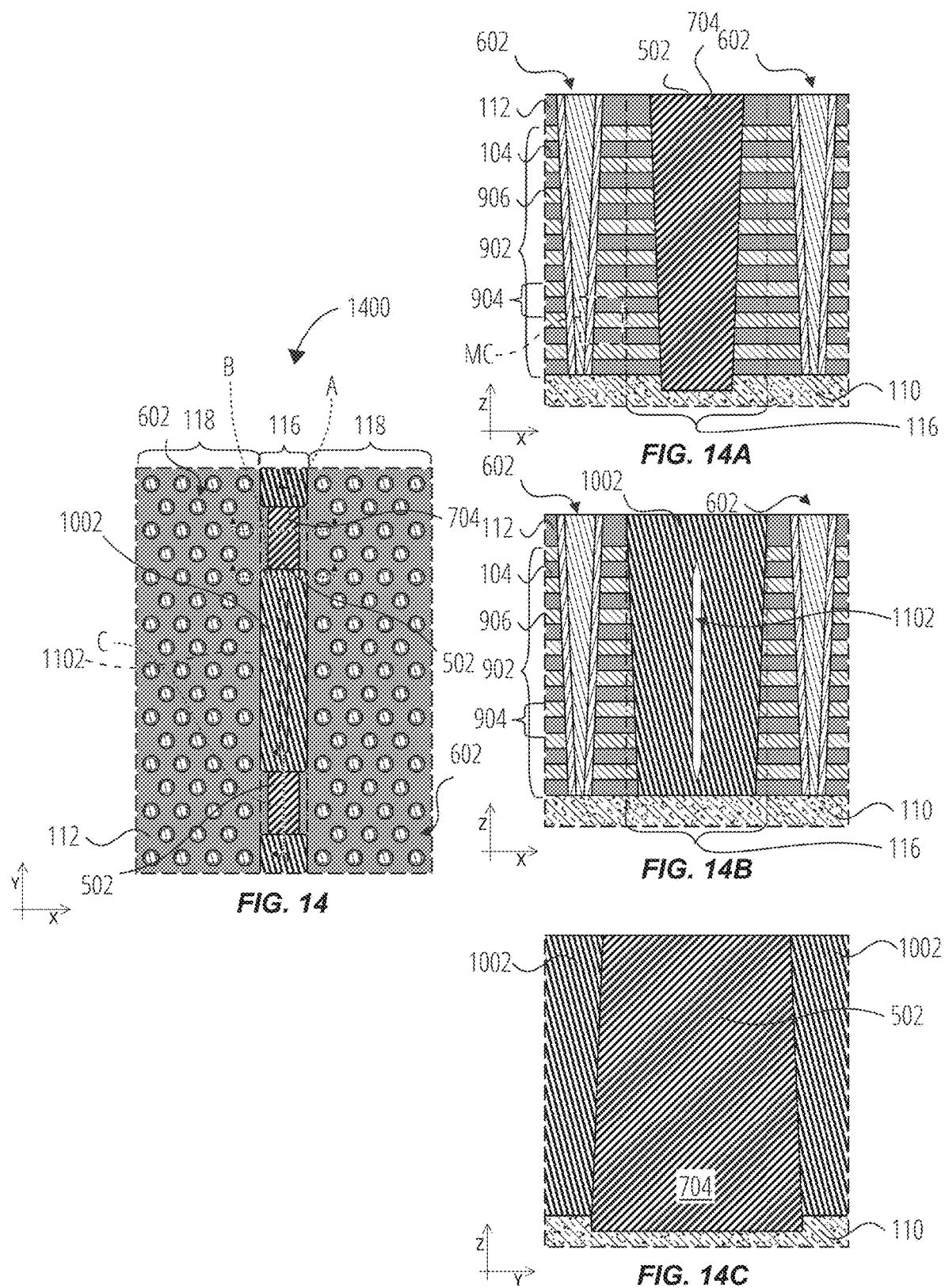

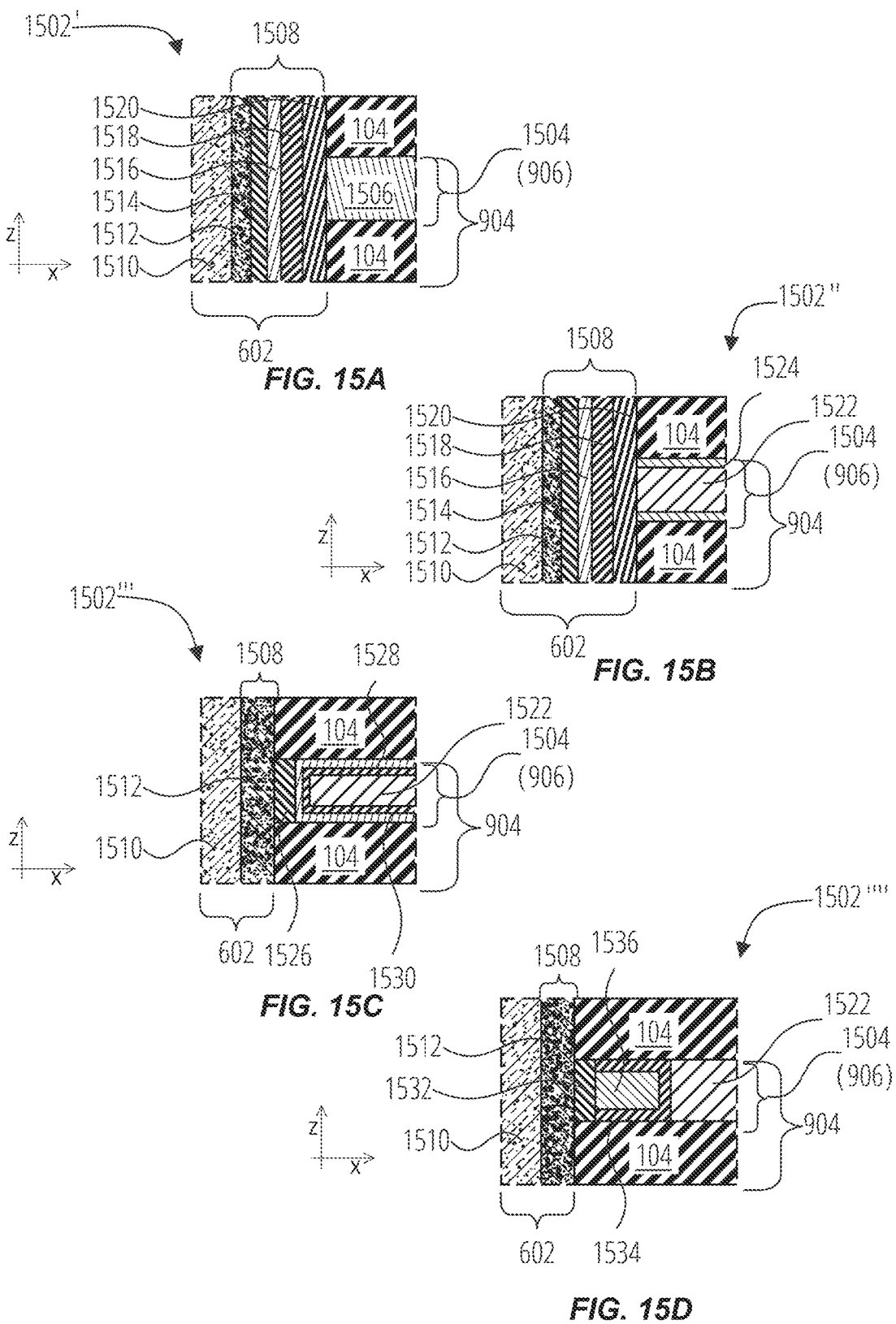

US 11,723,196 B2

MICROELECTRONIC DEVICES WITH SUPPORT PILLARS SPACED ALONG A SLIT REGION BETWEEN PILLAR ARRAY BLOCKS, AND RELATED SYSTEMS

TECHNICAL FIELD

Embodiments of the disclosure relate to the field of microelectronic device design and fabrication. More particularly, the disclosure relates to methods for forming microelectronic devices (e.g., memory devices, such as 3D NAND memory devices) having tiered stack structures that include vertically alternating conductive structures and insulative structures, to related systems, and to methods for forming such structures and devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line).

In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically alternate conductive materials with insulating (e.g., dielectric) materials. The conductive materials function as control gates for, e.g., access lines (e.g., word lines) of the memory cells. Vertical structures (e.g., pillars comprising channel structures and tunneling structures) extend along the vertical string of memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source line. A 3D NAND memory device also includes electrical connections between, e.g., access lines (e.g., word lines) and other conductive structures of the device so that the memory cells of the vertical strings can be selected for writing, reading, and erasing operations.

Forming 3D NAND memory devices tends to present challenges. For example, differing residual stresses may result in some features bending away from an intended, true-vertical orientation. As another example, forming some features may result in voids or seams that can present structural failure points during subsequent processing, handling, or use. Thus, reliably fabricating the features of microelectronic devices, such as 3D NAND memory devices, presents challenges.

BRIEF DESCRIPTION OF THE DRAWINGS

FIG. 1 through FIG. 10, with respect to the figures numbered without a letter accompaniment, are top plan, schematic illustrations during various stages of processing to fabricate a microelectronic device structure, such as the microelectronic device structure of FIG. 10, in accordance with embodiments of the disclosure, wherein:

FIG. 2A is a cross-sectional, elevational, schematic illustration taken along section line A of FIG. 2; FIG. 2B is a cross-sectional, elevational, schematic illustration taken along section line B of FIG. 2; and FIG. 2C is a cross-sectional, elevational, schematic illustration taken along section line C of FIG. 2;

FIG. 3A is a cross-sectional, elevational, schematic illustration taken along section line A of FIG. 3; FIG. 3B is a cross-sectional, elevational, schematic illustration taken along section line B of FIG. 3; and FIG. 3C is a cross-sectional, elevational, schematic illustration taken along section line C of FIG. 3;

FIG. 4A is a cross-sectional, elevational, schematic illustration taken along section line A of FIG. 4; FIG. 4B is a cross-sectional, elevational, schematic illustration taken along section line B of FIG. 4; and FIG. 4C is a cross-sectional, elevational, schematic illustration taken along section line C of FIG. 4;

FIG. 6A is a cross-sectional, elevational, schematic illustration taken along section line A of FIG. 6; FIG. 6B is a cross-sectional, elevational, schematic illustration taken along section line B of FIG. 6; and FIG. 6C is a cross-sectional, elevational, schematic illustration taken along section line C of FIG. 6;

FIG. 7A is a cross-sectional, elevational, schematic illustration taken along section line A of FIG. 7; FIG. 7B is a cross-sectional, elevational, schematic illustration taken along section line B of FIG. 7; FIG. 7C is a cross-sectional, elevational, schematic illustration taken along section line C of FIG. 7; and FIG. 7D is a cross-sectional, elevational, schematic illustration taken along section line D of FIG. 7;

FIG. 8A is a cross-sectional, elevational, schematic illustration taken along section line A of FIG. 8; FIG. 8B is a cross-sectional, elevational, schematic illustration taken along section line B of FIG. 8; FIG. 8C is a cross-sectional, elevational, schematic illustration taken along section line C of FIG. 8; and FIG. 8D is a cross-sectional, elevational, schematic illustration taken along section line D of FIG. 8;

FIG. 9A is a cross-sectional, elevational, schematic illustration taken along section line A of FIG. 9; FIG. 9B is a cross-sectional, elevational, schematic illustration taken along section line B of FIG. 9; FIG. 9C is a cross-sectional, elevational, schematic illustration taken along section line C of FIG. 9; and FIG. 9D is a cross-sectional, elevational, schematic illustration taken along section line D of FIG. 9; and FIG. 10A is a cross-sectional, elevational, schematic illustration taken along section line A of FIG. 10; FIG. 10B is a cross-sectional, elevational, schematic illustration taken along section line B of FIG. 10; FIG. 10C is a cross-sectional, elevational, schematic illustration taken along section line C of FIG. 10; and FIG. 10D is a cross-sectional, elevational, schematic illustration taken along section line D of FIG. 10.

FIG. 11 is a top plan, schematic illustration of a microelectronic device structure, in accordance with embodiments of the disclosure and which may have been formed by the various stages illustrated in FIG. 1 through FIG. 9, with FIG. 11 further representing a stage of processing following that of FIG. 9, wherein FIG. 11A is a cross-sectional, elevational, schematic illustration taken along section line A of FIG. 11; FIG. 11B is a cross-sectional, elevational, schematic illustration taken along section line B of FIG. 11; FIG. 11C is a cross-sectional, elevational, schematic illustration taken along section line C of FIG. 11; and FIG. 11D is a cross-sectional, elevational, schematic illustration taken along section line D of FIG. 11.

FIG. 12 through FIG. 14, with respect to the figures numbered without a letter accompaniment, are top plan, schematic illustrations during various stages of processing to fabricate a microelectronic device structure, such as the microelectronic device structure of FIG. 14, in accordance with embodiments of the disclosure, the stage of FIG. 12 following that of FIG. 1, wherein:

FIG. 12A is a cross-sectional, elevational, schematic illustration taken along section line A of FIG. 12; FIG. 12B is a cross-sectional, elevational, schematic illustration taken along section line B of FIG. 12; and FIG. 12C is a cross-sectional, elevational, schematic illustration taken along section line C of FIG. 12;

FIG. 14A is a cross-sectional, elevational, schematic illustration taken along section line A of FIG. 14; FIG. 14B is a cross-sectional, elevational, schematic illustration taken along section line B of FIG. 14; and FIG. 14C is a cross-sectional, elevational, schematic illustration taken along section line C of FIG. 14.

FIG. 15A, FIG. 15B, FIG. 15C, and FIG. 15D are cross-sectional, elevational, schematic illustrations of memory cells, in accordance with embodiments of the disclosure, the illustrated areas each corresponding to, e.g., dashed-lined, boxed portion of FIG. 10, FIG. 11, and/or FIG. 14.

DETAILED DESCRIPTION

Figure 1:
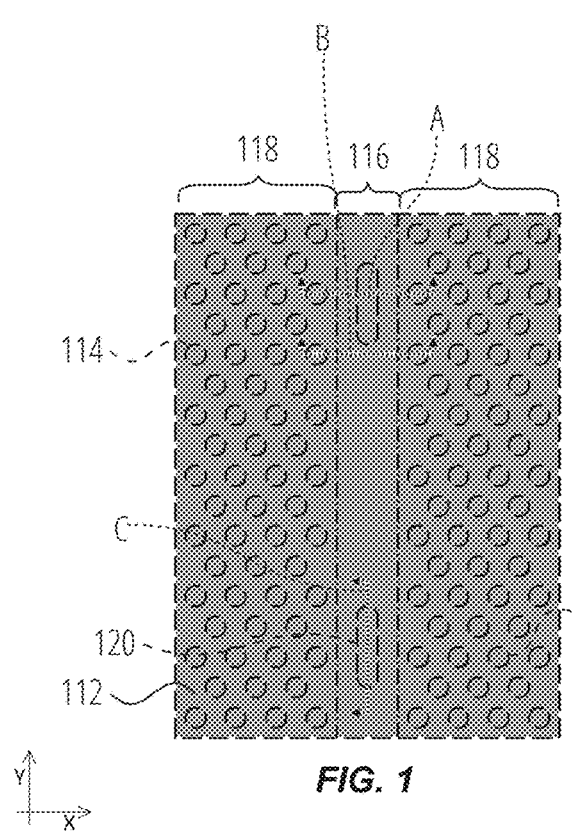

Structures (e.g., microelectronic device structures), apparatus (e.g., microelectronic devices), and systems (e.g., electronic systems), in accordance with embodiments of the disclosure, include a stack of vertically alternating conductive structures and insulative structures arranged in tiers, through which pillars vertically extend. Slit structures separate blocks of pillar arrays from one another. Intermittent to the slit structures are support pillars of insulative material. The support pillars interrupt what would otherwise have been a continuous, elongate slit structure that may have provided a line of structural weakness that may have been prone to material failure (e.g., physical cracking) during subsequent processing, handling, or use. The support pillars, intermittent to the slit structures, also provide enhanced structural support, throughout a height of the support pillars and the stack. This enhanced structural support may inhibit neighboring blocks of pillar arrays from bending toward or away from one another. Accordingly, microelectronic device structures may be formed with enhanced structural integrity, such as less block bending and less likelihood of cracks forming between blocks.

As used herein, the terms "opening," "trench," "slit," "recess," "void," and "seam" mean and include a volume extending through or into at least one structure or at least one material, leaving a gap in that at least one structure or at least one material, or a volume extending between structures or materials, leaving a gap between the structures or materials. Unless otherwise described, an "opening," "trench," "slit," and/or "recess" is not necessarily empty of material. That is, an "opening," "trench," "slit," or "recess" is not necessarily void space. An "opening," "trench," "slit," or "recess" formed in or between structures or materials may comprise structure(s) or material(s) other than that in or between which the opening is formed. And, structure(s) or material(s) "exposed" within an opening, trench, slit, or recess is/are not necessarily in contact with an atmosphere or non-solid environment. Structure(s) or material(s) "exposed" within an opening, trench, slit, or recess may be adjacent or in contact with other structure(s) or material(s) that is/are disposed within the opening, trench, slit, or recess. In contrast, unless otherwise described, a "void" and/or "seam" may be substantially or wholly empty of material. A "void" or "seam" formed in or between structures or materials may not comprise structure(s) or material(s) other than that in or between which the "void" or "seam" is formed. And, structure(s) or material(s) "exposed" within a "void" or "seam" may be in contact with an atmosphere or non-solid environment.

As used herein, the terms "trench," "slit," and "seam" mean and include an elongate opening, while the terms "opening" and "void" may include either or both an elongate opening or elongate void, respectively, and/or a non-elongate opening or a non-elongate void.

As used herein, the terms "substrate" and "base structure" mean and include a base material or other construction upon which components, such as those within memory cells, are formed. The substrate or base structure may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base structure" in the following description, previous process stages may have been utilized to form materials, structures, or junctions in the base semiconductor structure, base structure, or other foundation.

As used herein, the term "insulative," when used in reference to a material or structure, means and includes a material or structure that is electrically insulating. An "insulative" material or structure may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric carboxynitride material (e.g., a silicon carboxynitride ($SiO_xC_zN_y$)), and/or air. Formulae including one or more of "x," "y," and/or "z" herein (e.g., $SiO_x$, $AlO_x$, $HfO_x$, $NbO_x$, $NbO_x$, $TiO_x$, $SiN_y$, $SiO_xN_y$, $SiO_xC_zN_y$) represent a material that contains an average ratio of "x" atoms of one element, "y" atoms of another element, and/or "z" atoms of an additional element (if any), respectively, for every one atom of another element (e.g., Si, Al, Hf, Nb, Ti). As the formulae are representative of relative atomic ratios and not strict chemical structure, an insulative material or insulative structure may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "sacrificial," when used in reference to a material or structure, means and includes a material or structure that is formed during a fabrication process but which is removed (e.g., substantially removed) prior to completion of the fabrication process.

As used herein, the term "horizontal" means and includes a direction that is parallel to a primary surface of the substrate on which the referenced material or structure is located. The width and length of a respective material or structure may be defined as dimensions in a horizontal plane. With reference to the figures, the "horizontal" direction may be perpendicular to an indicated "Z" axis, may be parallel to an indicated "X" axis, and may be parallel to an indicated "Y" axis.

As used herein, the term "lateral" means and includes a direction in a horizontal plane parallel to a primary surface of the substrate on which a referenced material or structure is located and substantially perpendicular to a "longitudinal" direction. The width of a respective material or structure may be defined as a dimension in the lateral direction of the horizontal plane. With reference to the figures, the "lateral" direction may be parallel to an indicated "X" axis, may be perpendicular to an indicated "Y" axis, and may be perpendicular to an indicated "Z" axis.

As used herein, the term "longitudinal" means and includes a direction in a horizontal plane parallel to a primary surface of the substrate on which a referenced material or structure is located, and substantially perpendicular to a "lateral" direction. The length of a respective material or structure may be defined as a dimension in the longitudinal direction of the horizontal plane. With reference to the figures, the "longitudinal" direction may be parallel to an indicated "Y" axis, may be perpendicular to an indicated "X" axis, and may be perpendicular to an indicated "Z" axis.

As used herein, the term "vertical" means and includes a direction that is perpendicular to a primary surface of the substrate on which a referenced material or structure is located. The height of a respective material or structure may be defined as a dimension in a vertical plane. With reference to the figures, the "vertical" direction may be parallel to an indicated "Z" axis, may be perpendicular to an indicated "X" axis, and may be perpendicular to an indicated "Y" axis.

As used herein, the term "width" means and includes a dimension, along an indicated "X" axis in a horizontal plane (e.g., at a certain elevation, if identified), defining a maximum distance, along such "X" axis in the horizontal plane, of the material or structure in question. For example, a "width" of a structure that is at least partially hollow, or that is at least partially filled with one or more other material(s), is the horizontal dimension between outermost edges or sidewalls of the structure, such as an outer "X"-axis diameter for a hollow or filled, cylindrical structure.

As used herein, the term "length" means and includes a dimension, along an indicated "Y" axis in a horizontal plane (e.g., at a certain elevation, if identified), defining a maximum distance, along such "Y" axis in the horizontal plane, of the material or structure in question. For example, a "length" of a structure that is at least partially hollow, or that is at least partially filled with one or more other material(s), is the horizontal dimension between outermost edges or sidewalls of the structure, such as an outer "Y"-axis diameter for a hollow or filled, cylindrical structure.

As used herein, the terms "thickness" or "thinness" mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "proximate" is a spatially relative term used to describe disposition of one material, structure, or sub-structure near to another material, structure, or sub-structure. The term "proximate" includes dispositions of indirectly adjacent to, directly adjacent to, and internal to.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X"neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the term "consistent"-when referring to a parameter, property, or condition of one structure, material, feature, or portion thereof in comparison to the parameter, property, or condition of another such structure, material, feature, or portion of such same aforementioned structure, material, or feature-means and includes the parameter, property, or condition of the two such structures, materials, features, or portions being equal, substantially equal, or about equal, at least in terms of respective dispositions of such structures, materials, features, or portions. For example, two structures having "consistent" thickness as one another may each define a same, substantially same, or about the same thickness at X vertical distance from a feature, despite the two structures being at different elevations along the feature. As another example, one structuring having a "consistent" width may have two portions that each define a same, substantially same, or about the same width at elevation Y1 of such structure as at elevation Y2 of such structure.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0 percent met, at least 95.0 percent met, at least 99.0 percent met, or even at least 99.9 percent met.

As used herein, reference to an element as being "on" or "over" another element means and includes the element being directly on top of, adjacent to (e.g., laterally adjacent to, longitudinally adjacent to, vertically adjacent to), underneath, or in direct contact with the other element. It also includes the element being indirectly on top of, adjacent to (e.g., laterally adjacent to, longitudinally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the primary surface of the substrate or base structure(s) on which the reference material or structure is located. As used herein, a "level" and an "elevation" are each defined by a horizontal plane parallel to the primary surface. "Lower levels" and "lower elevations" are nearer to the primary surface of the substrate, while "higher levels" and "higher elevations" are further from the primary surface. Unless otherwise specified, these spatially relative terms are intended to encompass different orientations of the materials in addition to the orientation as depicted in the figures. For example, the materials in the figures may be inverted, rotated, etc., with the spatially relative "elevation" descriptors remaining constant because the referenced primary surface would likewise be respectively reoriented as well.

As used herein, the terms "comprising," "including," "having," and grammatical equivalents thereof are inclusive or open-ended terms that do not exclude additional, unrecited elements or method steps, but these terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a composition (e.g., gas) described as "comprising," "including," and/or "having" a species may be a composition that, in some embodiments, includes additional species as well and/or a composition that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" means and includes any and all combinations of one or more of the associated listed items.

As used herein, the singular forms "a," "an," and "the" are intended to include the plural forms as well, unless the context clearly indicates otherwise.

As used herein, a "(s)" at the end of a term means and includes the singular form of the term and/or the plural form of the term, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, sub-structure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

FIG. 1 through FIG. 10 (including the "A," "B," "C," and/or "D" views thereof) illustrate various stages of a method of forming a microelectronic device structure with support pillars in slits between pillar array blocks. With collective reference to FIG. 1, FIG. 1A (which is a cross-sectional, elevational view taken along section line A of FIG. 1), FIG. 1B (which is a cross-sectional, elevational view taken along section line B of FIG. 1), and FIG. 1C (which is a cross-sectional, elevational view taken along section line C of FIG. 1), a stack structure 102 may be formed, with insulative structures 104 vertically interleaved with sacrificial structures 106 and arranged in tiers 108. The stack structure 102 may be formed on, and may be supported by, one or more base structures 110.

The stack structure 102 may be formed by sequentially forming (e.g., depositing) material(s) of the insulative structure 104 and sacrificial material(s) of the sacrificial structure 106, which will eventually be replaced with conductive structures. Each of the tiers 108 may individually include a level of one of the insulative structures 104 directly vertically adjacent one or two levels of the sacrificial structures 106. One or more additional insulative structures 112 may be formed (e.g., deposited) above the stack structure 102.

The insulative structures 104 may be formed of and include at least one electrically insulative material, such as one or more of the insulative material(s) discussed above (e.g., a dielectric oxide material, such as silicon dioxide). In this and other embodiments described herein, the insulative material(s) of the insulative structures 104 may be the same or different than other insulative material(s) of the microelectronic device structure.

The sacrificial structures 106 may be formed of and include, as one or more sacrificial material(s), insulative material(s) different than, and exhibiting etch selectivity with respect to, the insulative material(s) of the insulative structures 104. The sacrificial structures 106 may be selectively etchable relative to the insulative structures 104 during common (e.g., collective, mutual) exposure to a first etchant; and the insulative structures 104 may be selectively etchable relative to the sacrificial structures 106 during common exposure to a second, different etchant. As used herein, a first material is "selectively etchable," relative to a second material, if the first material exhibits an etch rate that is at least about five times (5×) greater than the etch rate of the second material, such as about ten times (10×) greater, about twenty times (20×) greater, or about forty times (40×) greater. In some embodiments, the sacrificial structures 106 are formed of and include one or more of a dielectric nitride material (e.g., silicon nitride ($Si_3N_4$)) and a dielectric oxynitride material (e.g., silicon oxynitride). In some embodiments, the sacrificial structures 106 comprise silicon nitride and the insulative structures 104 comprise silicon dioxide.

In some embodiments, the additional insulative structure 112 above the stack structure 102 may be formed of and include an electrically insulative material, such as, for example, one or more of phosphosilicate glass (PSG), borosilicate glass (BSG), fluorosilicate glass (FSG), borophosphosilicate glass (BPSG), and silicon dioxide. In some embodiments, the additional insulative structure 112 comprises the same material composition as the insulative material of the insulative structures 104. In other embodiments, the additional insulative structure 112 comprises a different material composition than the insulative material of the insulative structures 104. In some embodiments, the additional insulative structure 112 (e.g., a single additional insulative structure 112) is formed of and includes silicon dioxide. The additional insulative structure 112 may be formed to be thicker than some or all of the insulative structures 104, individually.

The stack structure 102 may be formed on, and may be supported by, one or more base structures 110, such as a source structure (e.g., a source plate), which may be formed of and include, for example, a semiconductor material doped with one of P-type conductivity materials (e.g., polysilicon doped with at least one P-type dopant (e.g., one or more of boron, aluminum, and gallium)) or N-type conductivity materials (e.g., polysilicon doped with at least one N-type dopant (e.g., one or more of arsenic, phosphorous, and antimony)).

A lowest tier 108 of the stack structure 102 (e.g., a lowest insulative structure 104) may be directly on the base structure 110 (e.g., the source structure), or the stack structure 102 may overlie a deck structure comprising additional tiers (e.g., additional levels of the tiers 108 of the insulative structures 104 and the sacrificial structures 106).

The illustrated stack structure 102 may represent a single "deck" of the microelectronic device structure being fabricated. Additional deck(s) of tiers 108 may be below (e.g., formed on the base structure 110 prior to forming the stack structure 102 of FIG. 1) or may be above (e.g., formed on the stack structure 102 of FIG. 1) and may be separated from the stack structure 102 and from each other by one or more dielectric structure(s), such as one or more of the additional insulative structures 112.

The stack structure 102 may be formed and configured to enable formation, through the stack structure, of pillars (e.g., electrically active pillars) grouped into "blocks" to be separated from one another by slit structures, formed during subsequent processing. For example, the stack structure 102 may be configured to include a slit region 116 between each pair of neighboring blocks, each block having a pillar array region 118 sized to fit a pattern for pillar openings 114, which may be defined by a one or more reticles. The slit region 116 had a width wide enough for subsequent forming of block-defining slits, as well as being wide enough to accommodate a pattern for inter-slit pillar openings 120, which may be defined by the same one or more reticles or by one or more additional reticles.

Figure 1A:
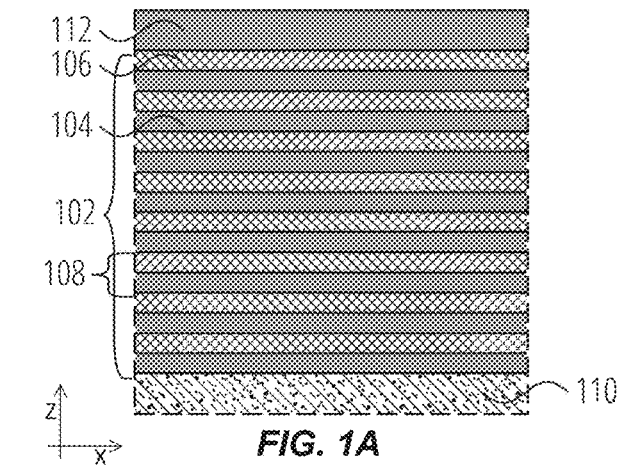
FIG. 1A is a cross-sectional, elevational, schematic illustration taken along section line A of FIG. 1.
Figure 1B:
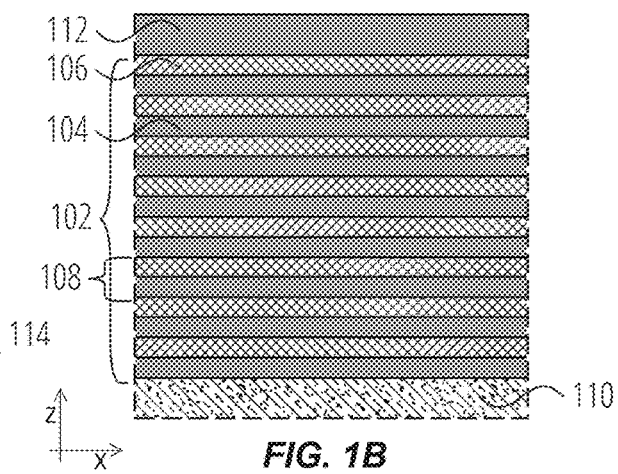
FIG. 1B is a cross-sectional, elevational, schematic illustration taken along section line B of FIG. 1.
Figure 1C:
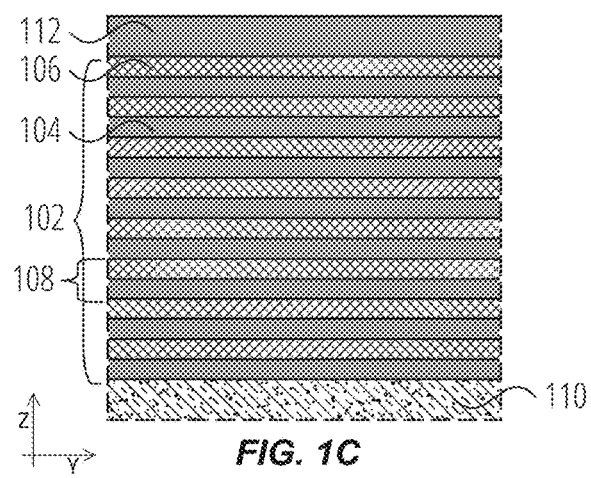
FIG. 1C is a cross-sectional, elevational, schematic illustration taken along section line C of FIG. 1.

With collective reference to FIG. 2, FIG. 2A (which is a cross-sectional, elevational view taken along section line A of FIG. 2), FIG. 2B (which is a cross-sectional, elevational view taken along section line B of FIG. 2), and FIG. 2C (which is a cross-sectional, elevational view taken along section line C of FIG. 2), pillar openings 202 may be formed in the pillar array regions 118, according to the pattern for pillar openings 114 (FIG. 1). For example, the pillar openings 202 may be etched through the additional insulative structure 112 and the tiers 108 of the stack structure 102 to the base structure 110. In some embodiments, the pillar openings 202 are substantially circular in cross-section and taper in width with increasing depth toward the base structure 110.

Inter-slit pillar openings 204 are formed in the slit regions 116, at spaced lengths along the slit region 116 in, e.g., the Y-axis direction. The inter-slit pillar openings 204 may be formed by etching through the additional insulative structure 112, the tiers 108 of the stack structure 102 at least to the base structure 110. In some embodiments, the inter-slit pillar openings 204 may extend at least partially into the base structure 110. Accordingly, FIG. 2A illustrates the inter-slit pillar opening 204 as extending into the base structure 110, while the pillar openings 202 extend to the base structure 110. The greater depth of the inter-slit pillar openings 204 may enable the to-be-formed inter-slit support pillars to anchor the stack structure 102 to the base structure 110, inhibiting delamination between the lowest tier 108 of the stack structure 102 and the upper surface of the base structure 110.

The inter-slit pillar openings 204 may define a larger, smaller, or substantially equal cross-sectional area compared to that of the pillar openings 202, individually. Moreover, The cross-sectional shape of the inter-slit pillar openings 204 may be, in some embodiments, the same or different than that of the pillar openings 202, individually.

In some embodiments, the cross-sectional shape of the inter-slit pillar openings 204 may be oblong, such as a relatively-elongated shape compared to the cross-sectional shape of the pillar openings 202. However, the disclosure is not limited to oblong-shaped inter-slit pillar openings 204. In other embodiments, the inter-slit pillar openings 204 may be formed to have other cross-sectional shapes.

The relative spacing of the inter-slit pillar openings 204, along each of the slit regions 116, may be tailored according to the structural support to be provided by the inter-slit pillars to be formed in the inter-slit pillar openings 204.

In some embodiments, the inter-slit pillar openings 204 may be formed, and the pattern for inter-slit pillar openings 120 of FIG. 1 may be configured, so that a width of each of the inter-slit pillar openings 204 is less than a width of the slit regions 116. Accordingly, each inter-slit pillar openings 204 may be formed substantially centrally to the width of each of the slit regions 116, with at least some portion of the slit region 116 remaining laterally between the inter-slit pillar openings 204 and each neighboring pillar array regions 118.

In some embodiments, the pillar openings 202 and the inter-slit pillar openings 204 may be formed substantially simultaneously, such that the inter-slit pillar openings 204 may be etched while the pillar openings 202 are etched through the stack structure 102. By concurrently forming the pillar openings 202 and the inter-slit pillar openings 204, the material-removal acts (e.g., etching acts) may be minimized and the relative horizontal spacing (e.g., positioning) of the inter-slit pillar openings 204 and the pillar openings 202 may be reliably controlled. In such embodiments, the greater cross-sectional area of the inter-slit pillar openings 204, relative to the pillar openings 202, may enable the inter-slit pillar openings 204 to be formed deeper, at least partially into the base structure 110, while the pillar openings 202 are formed to end at about the upper surface of the base structure 110.

In other embodiments, one of the inter-slit pillar openings 204 and the pillar openings 202 may be formed first followed by forming the other of the inter-slit pillar openings 204 and the pillar openings 202.

With collective reference to FIG. 3, FIG. 3A (which is a cross-sectional, elevational view taken along section line A of FIG. 3), FIG. 3B (which is a cross-sectional, elevational view taken along section line B of FIG. 3), and FIG. 3C (which is a cross-sectional, elevational view taken along section line C of FIG. 3), a hardmask 302 may be formed (e.g., nonconformally deposited) above the stack structure 102 (e.g., on the additional insulative structure 112). Openings 304 may be formed (e.g., etched) through the hardmask 302 to expose the inter-slit pillar openings 204 while leaving covered the pillar openings 202. The openings 304 may be sized to at least expose the top of the inter-slit pillar openings 204. In some embodiments, the openings 304 are also sized to expose portions of an upper surface of the additional insulative structure 112.

The pillar openings 202 may be left empty (e.g., void space) when covered by the hardmask 302. In other embodiments, one or more sacrificial materials (e.g., $Al_2O_3$) may be formed to substantially fill the pillar openings 202 before the hardmask 302 is formed.

The hardmask 302 may be formed of and include a material that is selectively etchable relative to the material(s) of the sacrificial. In some such embodiments, the hardmask 302 may be formed of and include, e.g., carbon, silicon dioxide, and/or a doped silicon nitride.

With collective reference to FIG. 4, FIG. 4A (which is a cross-sectional, elevational view taken along section line A of FIG. 4), FIG. 4B (which is a cross-sectional, elevational view taken along section line B of FIG. 4), and FIG. 4C (which is a cross-sectional, elevational view taken along section line C of FIG. 4), the sacrificial structures 106 may be recessed, relative to the insulative structures 104, such as by a nitride-selective etching act (e.g., a wet etch). Accordingly, recesses 402 are formed vertically between ends of the insulative structures 104 that border the inter-slit pillar openings 204.

The conditions and timing of the etching act may be controlled to ensure that the sacrificial structures 106 are not recessed beyond the horizontal boundaries (e.g., in the X-axis direction) of the slit regions 116. A maximum recess horizontal dimension 404 (e.g., in the X-axis direction) is no greater than a width (e.g., X-axis dimension) of the slit region 116, individually.

The widths (e.g., X-axis dimensions) and lengths (e.g., Y-axis dimensions) of the recesses 402 may not necessarily be consistent with one another at each level of the sacrificial structures 106 due to, for example, the nature of the etchant used in the etching process to form recess the sacrificial structures 106. Accordingly, along a central X-axis view of the inter-slit pillar opening 204, as in FIG. 4A, the maximum recess horizontal dimension 404 (e.g., maximum recess width) may be at about a middle elevation of the sacrificial structures 106, while, along a central Y-axis view of the inter-slit pillar opening 204, as in FIG. 4C, the maximum recess horizontal dimension 404 (e.g., maximum recess length) may be at an upper elevation of the sacrificial structures 106. Nonetheless, the recesses 402 may not extend into the pillar array regions 118.

Forming the inter-slit pillar openings 204 interrupts the levels of the insulative structures 104 between neighboring pillar array regions 118. Longitudinally adjacent the inter-slit pillar openings 204 along the slit region 116 (e.g., to the Y-axis, longitudinal sides of the inter-slit pillar opening 204), the insulative structures 104 continue to bridge between the neighboring pillar array regions 118. Bordering the inter-slit pillar openings 204, where the sacrificial structures 106 have been recessed to form the recesses 402, bridges 406 of the insulative structures 104 are interleaved with the recesses 402, but each level of the insulative structures 104 provides one of the bridges 406 between the neighboring pillar array regions 118. Laterally adjacent the inter-slit pillar openings 204 toward the pillar array regions 118 (e.g., to the X-axis lateral sides of the inter-slit pillar opening 204), the insulative structures 104 form extensions 408 that protrude into the inter-slit pillar openings 204 due to the formation of the recesses 402.

Figure 5:
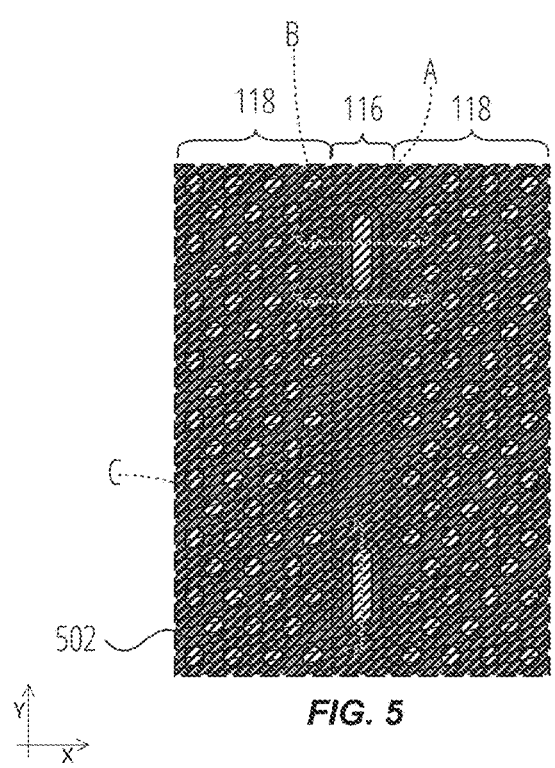
Figure 5A:
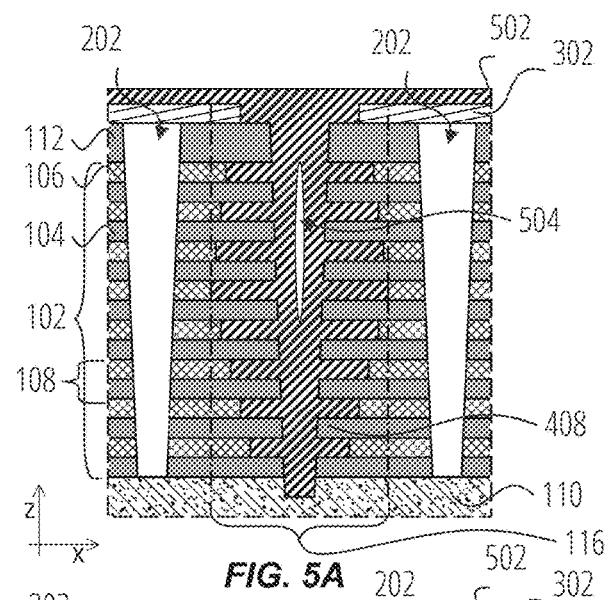
FIG. 5A is a cross-sectional, elevational, schematic illustration taken along section line A of FIG. 5.
Figure 5B:
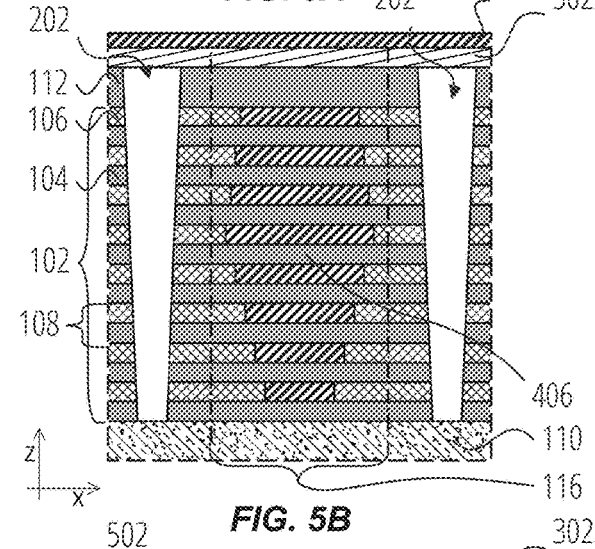
FIG. 5B is a cross-sectional, elevational, schematic illustration taken along section line B of FIG. 5.
Figure 5C:
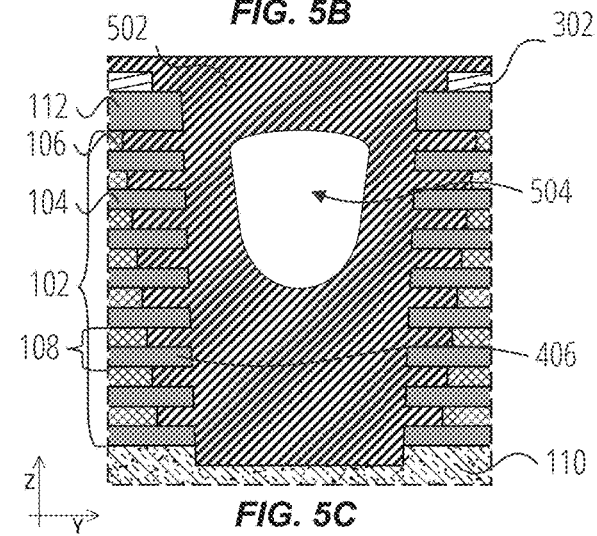
FIG. 5C is a cross-sectional, elevational, schematic illustration taken along section line C of FIG. 5.

With collective reference to FIG. 5, FIG. 5A (which is a cross-sectional, elevational view taken along section line A of FIG. 5), FIG. 5B (which is a cross-sectional, elevational view taken along section line B of FIG. 5), and FIG. 5C (which is a cross-sectional, elevational view taken along section line C of FIG. 5), insulative material(s) 502 may be formed (e.g., deposited, such as by ALD) in the inter-slit pillar openings 204 to fill the recesses 402 (FIG. 4A through FIG. 4C). The insulative material(s) 502 may be any of the aforementioned insulative material(s) for the insulative structures 104 or other insulative materials of the microelectronic device structure, provided that the insulative material(s) 502 are selectively etchable relative to the sacrificial structures 106. In some embodiments, the sacrificial structures 106 may comprise a silicon nitride, and the insulative material(s) 502 may be substantially free of nitride material(s).

In some embodiments the insulative material(s) 502 may have the same composition as that of the insulative structures 104. Nonetheless, interfaces between the insulative structures 104 and the insulative material(s) 502 may be detectable, upon inspection, due to the separate formation of these materials.

Forming the insulative material(s) 502 may or may not result in a seam 504 being formed within the insulative material(s) 502. In those embodiments in which the seam 504 is formed, the presence of the seam 504 may not be detrimental to subsequent fabrication acts because subsequent fabrication acts may not expose the seam 504 to, e.g., etchants.

The insulative material(s) 502 may extend from a level within the base structure 110 (e.g., in embodiments in which the inter-slit pillar openings 204 (FIG. 2) were formed to extend at least partially into the base structure 110) to at least a top of the stack structure 102 and, in some embodiments, through the additional insulative structure 112 as well.

The structure may then be planarized (e.g., by CMP) to remove the insulative material(s) 502 and the hardmask 302 that were overlying the additional insulative structure 112, as collectively illustrated in FIG. 6, FIG. 6A (which is a cross-sectional, elevational view taken along section line A of FIG. 6), FIG. 6B (which is a cross-sectional, elevational view taken along section line B of FIG. 6), and FIG. 6C (which is a cross-sectional, elevational view taken along section line C of FIG. 6). In some embodiments, some of the additional insulative structure 112 may also be removed.

Removing the hardmask 302 (e.g., FIG. 5A) exposes the pillar openings 202 (e.g., FIG. 5A). In embodiments in which sacrificial material(s) were formed to fill the pillar openings 202 prior to forming the hardmask 302, the sacrificial material(s) may be removed (e.g., etched) after removal of the hardmask 302 to again form the pillar openings 202.

With the pillar openings 202 exposed or reformed, pillars 602 may then be formed (e.g., deposited) in the pillar openings 202 (e.g., FIG. 5A), such as by methods known in the art, to form pillar arrays in the pillar array regions 118.

With collective reference to FIG. 7, FIG. 7A (which is a cross-sectional, elevational view taken along section line A of FIG. 7), FIG. 7B (which is a cross-sectional, elevational view taken along section line B of FIG. 7), FIG. 7C (which is a cross-sectional, elevational view taken along section line C of FIG. 7), and FIG. 7D (which is a cross-sectional, elevational view taken along section line D of FIG. 7), slits 702 may then be formed (e.g., etched) through the stack structure 102 in the slit regions 116. Rather than forming a single, elongate slit along a whole length of the slit region 116, the slits 702 are sized and configured in segments interspersed with the previously-formed insulative material(s) 502.

The slits 702 are also sized and configured to extend into the area of the maximum recess horizontal dimensions 404 and to remove at least a central portion of each level of the sacrificial structures 106 that previously remained to the Y-axis, longitudinal sides of the insulative material(s) 502. Such sizing may take into consideration, for example, any bowing of the recesses 402 (e.g., as in FIG. 4A and in FIG. 4B) or any tapering of the recesses (e.g., as in FIG. 4C), as well as any bowing or tapering of the slits 702 to be formed, to ensure that no level of the sacrificial structures 106 remains to extend fully across the slit region 116 between neighboring pillar array regions 118. Accordingly, as illustrated in FIG. 7C, along a centerline extending a length of the slit regions 116, inter-slit support pillars 704 are formed from the insulative material(s) 502, with the slits 702 bordered by remaining portions of the bridges 406 of the insulative structures 104 interleaved with the insulative material(s) 502 of the inter-slit support pillars 704, but with no sacrificial structure 106 portions remaining along the Y-axis center of the slit region 116. The bridges 406 of the insulative structures 104 that extend across the slit region 116 are illustrated in FIG. 7D, an X-axis view of the region longitudinally between one of the slits 702 and a central portion of the inter-slit support pillar 704.

During formation of the slits 702 (e.g., during etching), any seams 504 or other voids that may be present in the insulative material(s) 502 may not be exposed to the material-removing chemistry (e.g., the etchant) because at least upper levels of the inter-slit support pillars 704 (e.g., levels adjacent the additional insulative structure 112) may be substantially filled with the insulative material(s) 502. Accordingly, the presence of the seams 504 or other voids in the insulative material(s) 502 may not be detrimental to formation of the slits 702.

After forming the slits 702 at select locations along the slit region 116, the remnants of the sacrificial structures 106 may be substantially removed (e.g., exhumed), as collectively illustrated in FIG. 8, FIG. 8A (which is a cross-sectional, elevational view taken along section line A of FIG. 8), FIG. 8B (which is a cross-sectional, elevational view taken along section line B of FIG. 8), FIG. 8C (which is a cross-sectional, elevational view taken along section line C of FIG. 8), and FIG. 8D (which is a cross-sectional, elevational view taken along section line D of FIG. 8). Exhuming the sacrificial structures 106 (e.g., FIG. 7A), leaves a stack structure 802 with tiers 804 comprising the insulative structures 104 interleaved with voids 806 formed where the sacrificial structures 106 (e.g., FIG. 7A) had been. Because slits 702 were formed in such a manner to ensure that no level of sacrificial structure 106 extended continuously across the slit region 116 between two neighboring pillar array regions 118, exhuming the sacrificial structures 106 does not form any voids 806 to the Y-axis, longitudinal sides of the inter-slit support pillars 704, at least along a center of the width of the inter-slit support pillars 704. Accordingly, as illustrated in FIG. 8C, for the slits 702, the sidewalls that cross the width of the slit regions 116, are sidewalls formed of the insulative material(s) 502 and remnants of the insulative structures 104, the latter providing the bridges 406 between the neighboring pillar array regions 118.

With collective reference to FIG. 9, FIG. 9A (which is a cross-sectional, elevational view taken along section line A of FIG. 9), FIG. 9B (which is a cross-sectional, elevational view taken along section line B of FIG. 9), FIG. 9C (which is a cross-sectional, elevational view taken along section line C of FIG. 9), and FIG. 9D (which is a cross-sectional, elevational view taken along section line D of FIG. 9), one or more conductive materials may be formed in the voids 806 (e.g., FIG. 8A) to effectively replace the sacrificial structures 106 (e.g., FIG. 7A). Accordingly, a stack structure 902 is formed with tiers 904 of the insulative structures 104 and conductive structures 906. The insulative structures 104 and the conductive structures 906 are vertically interleaved throughout the stack structure 902. Because of the configuration of the slits 702, no level of the conductive structures 906 fully spans the slit region 116. Therefore, the conductive structures 906 in one of the pillar array regions 118 is spaced from the conductive structures 906 in neighboring pillar array regions 118, due to the configuration of the slits 702 and due to the insulative nature of the inter-slit support pillars 704 and the bridges 406 of the insulative structures 104, which do span the slit region 116, at least longitudinally adjacent the inter-slit support pillars 704.

The conductive structures 906 may be formed of and include electrically conductive material, such one or more of at least one metal (e.g., one or more of tungsten, titanium, nickel, platinum, rhodium, ruthenium, iridium, aluminum, copper, molybdenum, silver, gold), at least one alloy (e.g., an alloy of one or more of the aforementioned metals), at least one metal-containing material that includes one or more of the aforementioned metals (e.g., metal nitrides, metal silicides, metal carbides, metal oxides, such as a material including at least one of titanium nitride (TiN), tantalum nitride (TaN), tungsten nitride (WN), titanium aluminum nitride (TiAlN), iridium oxide (IrO$_x$), ruthenium oxide (RuO$_x$), alloys thereof), at least one conductively-doped semiconductor material (e.g., conductively-doped silicon, conductively-doped germanium, conductively-doped silicon germanium), polysilicon, and/or at least one other material exhibiting electrical conductivity. In some embodiments, the conductive structures 906 include at least one of the aforementioned electrically conductive materials along with at least one additional electrically conductive material formed as a liner. For example, the conductive structures 906 may include at least one of the aforementioned metals and a conductive liner comprising at least one of the aforementioned metal-containing materials. For example, some or all of the conductive structures 906 may include a conductive nitride liner (e.g., a tungsten nitride liner) with a conductive metal (e.g., tungsten) surrounded at least in part by the conductive nitride liner. The conductive liner may be directly adjacent the insulative structures 104. In other embodiments, the conductive structures 906 may consist essentially of or consist of one conductive material, or a homogenous combination of conductive materials, with the conductive material(s) directly adjacent and extending between vertically adjacent insulative structures 104, e.g., without a distinguishable conductive liner.

The conductive structures 906 may be configured as "replacement gate" word lines (e.g., word lines formed through so-called "replacement gate" or "gate late" processing). In some embodiments, a number (e.g., quantity) of the tiers 904 of the stack structure 902—and therefore the number of conductive structures 906 in the stack structure 902—may be within a range of from thirty-two of the tiers 904 (and of the conductive structures 906) to two hundred fifty-six of the tiers 904 (and of the conductive structures 906). In some embodiments, the stack structure 902 includes one hundred twenty-eight of the tiers 904 (and of the conductive structures 906). However, the disclosure is not so limited, and the stack structure 902 may include a different number of the tiers 904 (and of the conductive structures 906).

With collective reference to FIG. 10, FIG. 10A (which is a cross-sectional, elevational view taken along section line A of FIG. 10), FIG. 10B (which is a cross-sectional, elevational view taken along section line B of FIG. 10), FIG. 10C (which is a cross-sectional, elevational view taken along section line C of FIG. 10), and FIG. 10D (which is a cross-sectional, elevational view taken along section line D of FIG. 10), one or more nonconductive materials may be formed in the slits 702 (e.g., FIG. 9) to form a microelectronic device structure 1000 with slit structures 1002 extending between the inter-slit support pillars 704 in the slit regions 116. The bridges 406 of the insulative structures 104 may be directly adjacent (e.g., directly horizontally adjacent, directly longitudinally adjacent) the slit structures 1002.

The slit structures 1002 may be formed of and include a nonconductive material. For example, the slit structures 1002 may be formed of and include a dielectric material, such as one or more of a dielectric oxide material (e.g., silicon dioxide), a dielectric nitride material (e.g., silicon nitride), and/or a nonconductive polymer material. In some embodiments, the slit structures 1002 are formed of and include one or more of phosphosilicate glass (PSG), borosilicate glass (BSG), fluorosilicate glass (FSG), borophosphosilicate glass (BPSG), and silicon dioxide. In some embodiments, the slit structures 1002 comprise silicon dioxide. The material of the slit structures 1002 may be formulated or otherwise configured to serve as a stress-compensating material.

Due to the presence of the inter-slit support pillars 704, and due to the presence of the bridges 406 of the insulative structures 104 that span the slit region 116 and continue from one pillar array region 118 to another, the physical stability of the blocks, which each comprise one of the pillar array regions 118, may be reinforced. That is, the presence of the inter-slit support pillars 704 and the bridges 406 may inhibit neighboring blocks (e.g., neighboring pillar array regions 118) from being toward or away from one another during processing, such as during formation of the slits 702 (e.g., FIG. 7), during the exhumation of the sacrificial structures 106 (e.g., FIG. 8A), and/or during filling of the slits 702 with the material of the slit structures 1002. Accordingly, the inter-slit support pillars 704 and the bridges 406 provide enhanced structural support to the microelectronic device structure 1000, particularly to the blocks (e.g., the pillar array regions 118) of the microelectronic device structure 1000.

Moreover, because of the enhanced structural support to the pillar array regions 118 provided by the inter-slit support pillars 704 and the bridges 406 of the insulative structures 104, in some embodiments, the material of the slit structures 1002 may be selected from a greater variety of materials than many have otherwise been considered in conventional structures. For example, the microelectronic device structures 1000 may be formed of materials with less independent material strength and stability, such as materials that may be relatively less rigid or relatively less strong, than may otherwise have been necessary for between-block (e.g., between-pillar-array) slit structure materials. Accordingly, in some embodiments, one or more materials of the slit structures 1002 may be formed from and include a liquid, during one or more portions of forming the slit structures 1002. Such a liquid may or may not be subsequently treated (e.g., heat treated) to solidify the slit structures 1002.

Accordingly, disclosed is a microelectronic device. The microelectronic device comprises a stack structure. The stack structure comprises a vertically alternating sequence of insulative structures and conductive structures arranged in tiers. At least one slit region divides the stack structure into blocks. Each block comprises an array of active pillars. Along the at least one slit region is a horizontally alternating sequence of slit structure segments and support pillar structures. The slit structure segments and the support pillar structures each extend vertically through the stack structure.

With collective reference to FIG. 11, FIG. 11A (which is a cross-sectional, elevational view taken along section line A of FIG. 11), FIG. 11B (which is a cross-sectional, elevational view taken along section line B of FIG. 11), FIG. 11C (which is a cross-sectional, elevational view taken along section line C of FIG. 11), and FIG. 11D (which is a cross-sectional, elevational view taken along section line D of FIG. 11), in additional embodiments, a microelectronic device structure 1100 may include slit structures 1002 that are non-monolithic. For example, one or more seams 1102 may be formed in the material of the slit structures 1002. Because the slit structures 1002 are formed in segments spaced by the inter-slit support pillars 704, and spaced by the bridges 406 of the insulative structures 104, the presence of the seams 1102 in the slit structures 1002 may not present a significant point of structural failure (e.g., cracking) during subsequent processing or during use. Accordingly, there may be fewer restrictions on formation of the material of the slit structures 1002 compared to, e.g., if the slit structures were formed as singular, elongate structures extending a full length of the slit regions 116.

In some embodiments, the improved structural support (and, e.g., lessened likelihood of block bending) and avoidance of points of material failure is achieved even without bridges 406 of the insulative structures 104 spanning the slit regions 116. Accordingly, recessing the sacrificial structures 106 (e.g., FIG. 4A) may be omitted. For example, FIG. 12 (along with FIG. 12A, FIG. 12B, and FIG. 12C) through FIG. 14 (along with FIG. 14A, FIG. 14B, and FIG. 14C) illustrate such an embodiment.

Figures 12, 12A, 12B, 12C:
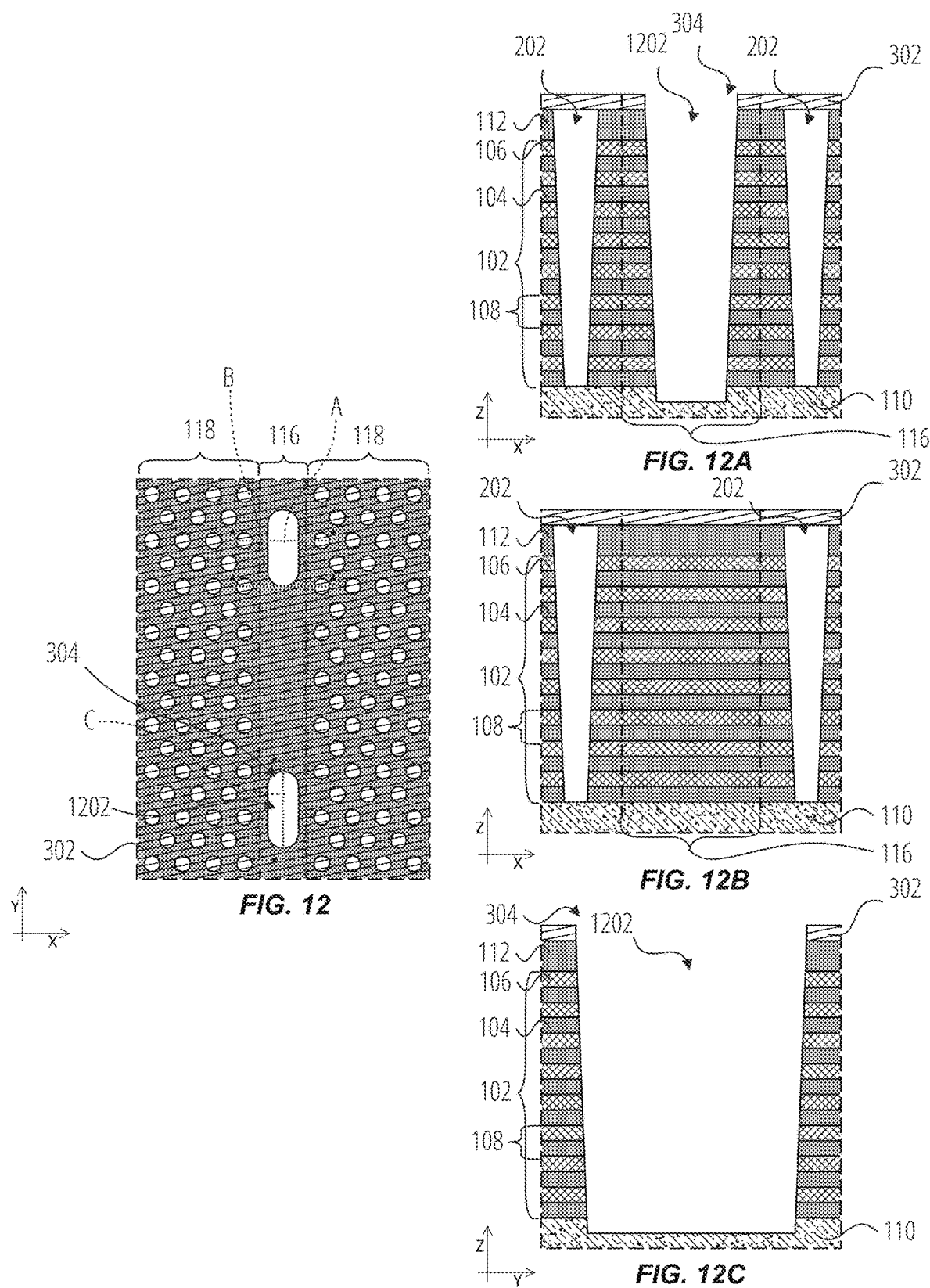

The stage illustrated in FIG. 12 (and in FIG. 12A, which is a cross-sectional, elevational view taken along section line A of FIG. 12; in FIG. 12B, which is a cross-sectional, elevational view taken along section line B of FIG. 12; and in FIG. 12C, which is a cross-sectional, elevational view taken along section line C of FIG. 12) may follow that described above with reference to FIG. 1. According to FIG. 12, inter-slit pillar openings 1202 formed (e.g., etched) through the stack structure 102 for the inter-slit support pillars 704 (e.g., FIG. 11), may be more broader in width and/or longer in length than in embodiments in which the sacrificial structures 106 are to be recessed. Nonetheless, the inter-slit pillar openings 1202 are sized and formed so as not to extend beyond the width of the slit region 116.

In some embodiments, the inter-slit pillar openings 1202 and the pillar openings 202 may be concurrently formed (e.g., etched) through the stack structure 102, and then the hardmask 302 may be formed to cover at least the pillar openings 202 (e.g., with or without first forming sacrificial material(s) to fill the pillar openings 202). In other embodiments, the pillar openings 202 may be formed in the stack structures 102 first, then the hardmask 302 formed over the pillar openings 202 (e.g., with or without first forming sacrificial material(s) to fill the pillar openings 202), and then hardmask 302 may be patterned to define the openings 304, which may then be transferred down through the stack structure 102 to form the inter-slit pillar openings 1202.

Figure 13:
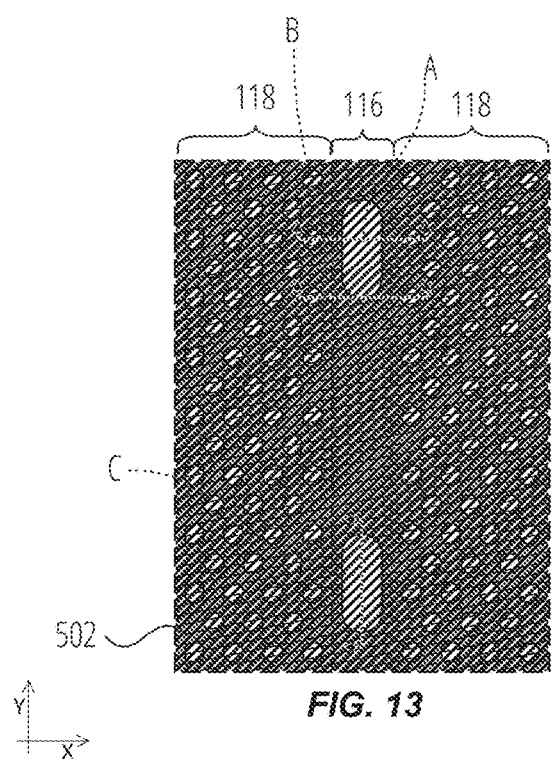
Figure 13A:
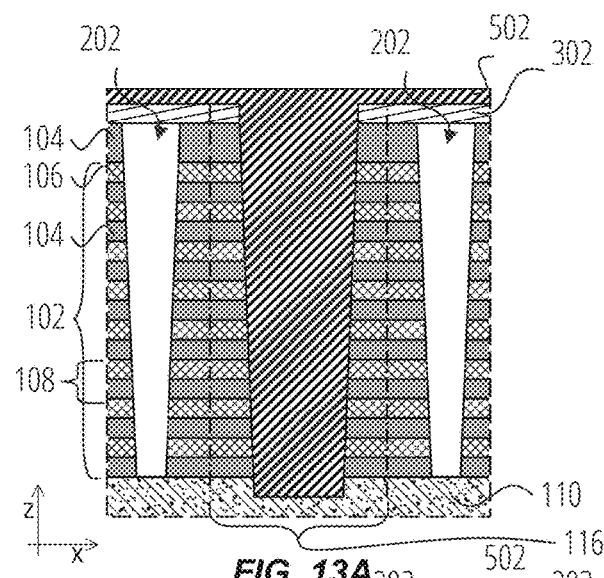
FIG. 13A is a cross-sectional, elevational, schematic illustration taken along section line A of FIG. 13.
Figure 13B:
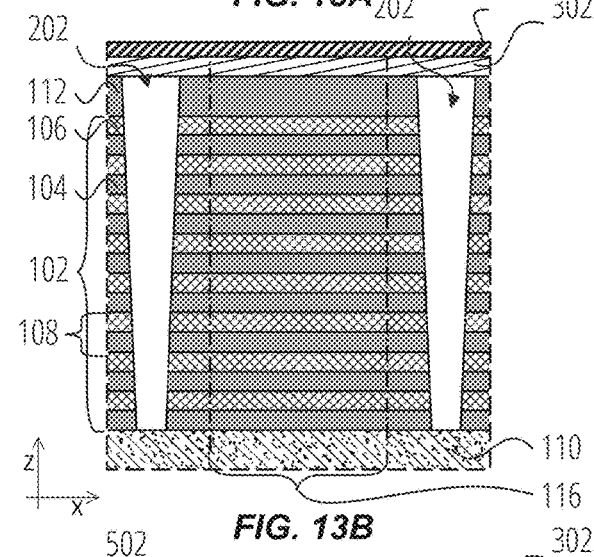
FIG. 13B is a cross-sectional, elevational, schematic illustration taken along section line B of FIG. 13.
Figure 13C:
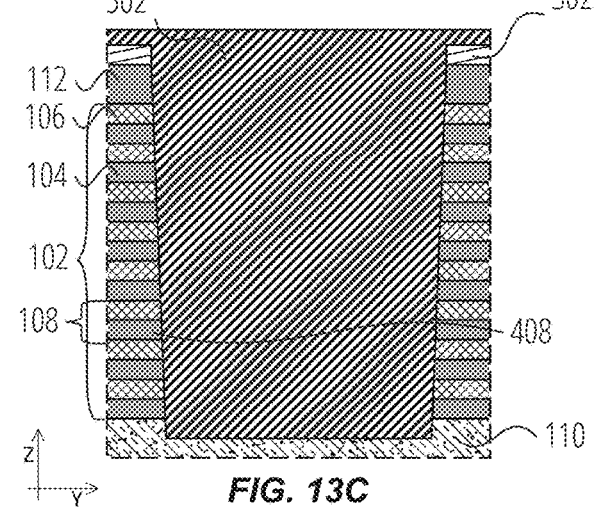
FIG. 13C is a cross-sectional, elevational, schematic illustration taken along section line C of FIG. 13.

Without first recessing the sacrificial structures 106, the inter-slit pillar openings 1202 may then be filled, as collectively illustrated in FIG. 13, FIG. 13A (which is a cross-sectional, elevational view taken along section line A of FIG. 13), FIG. 13B (which is a cross-sectional, elevational view taken along section line B of FIG. 13), and in FIG. 13C (which is a cross-sectional, elevational view taken along section line C of FIG. 13). For example, as described above, the insulative material(s) 502 may be formed. Forming the insulative material(s) 502 may, in some embodiments, form voids or seams in the insulative material(s) 502. In other embodiments, the insulative material(s) 502 may be formed to be free of voids or seams.

The fabrication process may then proceed as described above with reference to FIG. 1 through FIG. 11. For example, the structure may be planarized (e.g., via CMP) to remove the upper elevations of the insulative material(s) 502 and to remove the hardmask 302. Slits 702 (e.g., FIG. 7) may be formed in segments along the slit region 116, separated by the insulative material(s) 502 of the inter-slit support pillars 704 (e.g., FIG. 7). Then, the sacrificial structures 106 may be substantially exhumed and replaced by the conductive structures 906, and nonconductive material(s) formed in the slits 702 (e.g., with or without seams 1102) to form the slit structures 1002, as illustrated in FIG. 14, FIG. 14A

(which is a cross-sectional, elevational view taken along section line A of FIG. 14), FIG. 14B (which is a cross-sectional, elevational view taken along section line B of FIG. 14), and FIG. 14C (which is a cross-sectional, elevational view taken along section line C of FIG. 14).

As in the embodiments described above, the slits 702 (e.g., FIG. 7) may have been sized and configured to ensure no level of the sacrificial structures 106 (e.g., FIG. 13C) remains spanning the entirety of the slit region 116. Accordingly, no elevation of the conductive structures 906 fully spans the width of the slit region 116 in the microelectronic device structure 1400.

Without recessing the sacrificial structures 106 (e.g., FIG. 13A) between forming the inter-slit pillar openings 1202 (FIG. 12) and forming the insulative material(s) 502 of the inter-slit support pillars 704, the inter-slit support pillars 704 may be directly adjacent (e.g., directly longitudinally adjacent) the slit structures 1002 without bridges 406 (e.g., FIG. 10C) of the insulative structures 104 along the interface between the slit structures 1002 and the inter-slit support pillars 704, as illustrated in FIG. 14C.

In some embodiments, the sidewalls of the conductive structures 906 may substantially align with (e.g., be substantially coplanar with) sidewalls of the insulative structures 104 along the inter-slit support pillars 704, such as illustrated in FIG. 14A and FIG. 14B due to the lack of recessing of the sacrificial structures 106 prior to formation of the insulative material(s) 502 of the inter-slit support pillars 704 and due to fully replacing the sacrificial structures 106 with the conductive structures 906. In other embodiments, the conductive structures 906 may be formed to not fully fill the voids 806 (e.g., FIG. 8B) left by exhuming the sacrificial structures 106 (FIG. 7B), such that the conductive structures 906 may nonetheless be somewhat recessed relative to the insulative structures 104 in the microelectronic device structure 1400.

In the microelectronic device structure 1400 the presence of the inter-slit support pillars 704, even without bridges 406 of the insulative structures 104 spanning the slit region 116, may nonetheless provide structural support to the neighboring pillar array regions 118 during such processing acts as the formation of the slits 702 (e.g., FIG. 7), the exhumation of the sacrificial structures 106 (e.g., FIG. 7B to FIG. 8B), and during the formation of the material of the slit structures 1002. Accordingly, the inter-slit support pillars 704 may inhibit bending of neighboring blocks (e.g., neighboring pillar array regions 118) toward one another. In some embodiments, the inter-slit support pillars 704 may also inhibit neighboring blocks (e.g., neighboring pillar array regions 118) from bending away from one another, such as due to material adhesion between the insulative material(s) 502 of the inter-slit support pillars 704 and the neighboring materials of the stack structure 902.

Also, in the microelectronic device structure 1400, the presence of the inter-slit support pillars 704 interrupting the slit region 116, such that the slit structures 1002 are formed as segments rather than as single, elongate structures along a whole length of the slit region 116, the presence of any seams 1102 or other voids in the material of the slit structures 1002 may not present significant points of material failure (e.g., cracking) during subsequent processing or during operation, as described above with reference to FIG. 11 through FIG. 11C. FIG. 11C. In some embodiments, the slit structures 1002 may be formed with intentional seams 1102 or with other openings remaining in the slit structures 1002 without crack-formation concerns, due to the interruption of the slit region 116 by the presence of the inter-slit support pillars 704.

The illustrations of FIG. 1 through FIG. 14 (including views "A," "B," "C," and/or "D" thereof, as applicable) may represent one deck of a microelectronic device structure (e.g., the microelectronic device structure 1000 of FIG. 10, the microelectronic device structure 1100 of FIG. 11, the microelectronic device structure 1400 of FIG. 14). In additional embodiments, the microelectronic device structure may include more than one deck. In such multi-deck embodiments, each deck may be sequentially formed according to the fabrication methods described above. For example, the method of FIG. 1 through FIG. 10 may be carried out to form a first deck, and then the method of FIG. 1 through FIG. 10 may be repeated for each additional deck, with previously-formed decks represented by the base structure 110 illustrated in the figures. In still other embodiments, the structures illustrated in FIG. 1 through FIG. 14 (including views "A," "B," "C," and/or "D" thereof, as applicable) may represent more than one deck of the microelectronic device structure such that all of the tiers 108 of multiple (e.g., some or all) decks may be processed concurrently.

While the foregoing descriptions regard the insulative structures 104 being initially interleaved with sacrificial material(s) in the form of the sacrificial structures 106 (e.g., such that the microelectronic device structure is formed by a so-called "replacement gate" or "gate late" process), in other embodiments, that which is illustrated and described as the sacrificial structures 106 may not be sacrificial, but may be formed, from the start, as the material of the conductive structures 906 (e.g., such that the microelectronic device structure includes so-called "floating gates"). In these latter embodiments, the structures interleaved with the insulative structures 104 need not be exhumed and replaced. Otherwise, the fabrication method may be as described above.

Accordingly, disclosed is a method of forming a microelectronic device. The method comprises forming a stack structure comprising a vertically alternating sequence of insulative structures and other structures arranged in tiers. Arrays of pillar openings are formed extending through the stack structure. In a region between the arrays of pillar openings, a series of support pillar openings is formed. The support pillar openings extend through the stack structure. The support pillar openings are substantially filled with additional insulative material to form intermediate support pillar structures. Pillars are formed in the arrays of pillar openings, to form arrays of pillars. The pillars comprise at least one channel material. Neighboring arrays, of the arrays of pillars, are spaced by the region. A series of slits is formed in the region between the neighboring arrays. Each slit is horizontally interposed between a pair of support pillar structures formed from the intermediate support pillar structures. The series of slits is filled with nonconductive material to form a series of slit structure segments horizontally alternating with the support pillar structures.

The pillars 602 of the microelectronic device structures, structured and/or formed in accordance with embodiments of the disclosure, may provide strings of memory cells of a memory device. Accordingly, FIG. 15A through FIG. 15D illustrate, in enlarged views, memory cells 1502 (e.g., memory cell 1502' of FIG. 15A, memory cell 1502" of FIG. 15B, memory cell 1502''' of FIG. 15C, and memory cell 1502'''' of FIG. 15D) of a microelectronic device structure (e.g., the microelectronic device structure 1000 of FIG. 10, the microelectronic device structure 1100 of FIG. 11, and/or the microelectronic device structure 1400 of FIG. 14), in accordance with some embodiments of the disclosure. Each of the illustrations of FIG. 15A through FIG. 15D may represent a simplified enlarged view of box MC of FIG. 10A, FIG. 11A, and/or FIG. 14A, though without illustrating the tapering sidewalls of the pillars 602, for ease of illustration and discussion. Reference to one "memory cell 1502" or multiple "memory cells 1502" equally refer to one or multiple of any of the illustrated memory cells 1502 of FIG. 15A through FIG. 15D (e.g., memory cell 1502' of FIG. 15A, memory cell 1502" of FIG. 15B, memory cell 1502''' of FIG. 15C, and memory cell 1502'''' of FIG. 15D).

As illustrated in each of FIG. 15A through FIG. 15D, the memory cells 1502 are in the vicinity of at least one tier 904, with at least one of the insulative structures 104 vertically adjacent an other structure 1504, such as the conductive structure 906, formed of and includes conductive material(s) 1506, e.g., in embodiments in which the microelectronic device structure (e.g., the microelectronic device structure 1000 of FIG. 10, the microelectronic device structure 1100 of FIG. 11, and/or the microelectronic device structure 1400 of FIG. 14) is formed via a so-called "replacement gate" process. In other embodiments, the other structures 1504 may be formed of and include a conductive semiconductor-based material, e.g., in embodiments in which the microelectronic device structure (e.g., the microelectronic device structure 1000 of FIG. 10, the microelectronic device structure 1100 of FIG. 11, and/or the microelectronic device structure 1400 of FIG. 14) is formed in a so-called "floating gate" configuration.

Adjacent the tiers 904 with the insulative structures 104 and the other structures 1504 (e.g., the conductive structures 906) are materials of the pillar 602, including cell material(s) 1508 and an insulative material 1510. The cell material(s) 1508 include at least a channel material 1512. The channel material 1512 may be horizontally interposed between the insulative material 1510 and the tiers 904 of the stack structure 902 (e.g., FIG. 10A, FIG. 11A, FIG. 14A).

The insulative material 1510 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 1510 comprises silicon dioxide.

The channel material 1512 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 1512 includes amorphous silicon or polysilicon. In some embodiments, the channel material 1512 comprises a doped semiconductor material. The insulative material 1510 may be horizontally adjacent the channel material 1512.

In some embodiments, such as that of FIG. 15A, the cell material(s) 1508 of the memory cell 1502' also include a tunnel dielectric material 1514 (also referred to as a "tunneling dielectric material"), which may be horizontally adjacent the channel material 1512; a memory material 1516, which may be horizontally adjacent the tunnel dielectric material 1514; a dielectric blocking material 1518 (also referred to as a "charge blocking material"), which may be horizontally adjacent the memory material 1516; and a dielectric barrier material 1520, which may be horizontally adjacent the dielectric blocking material 1518.

The tunnel dielectric material 1514 may be formed of and include a dielectric material through which charge tunneling can be performed under suitable electrical bias conditions, such as through hot-carrier injection or by Fowler-Nordheim tunneling induced charge transfer. The tunnel dielectric material 1514 may be formed of and include one or more of silicon oxide, silicon nitride, silicon oxynitride, dielectric metal oxides (e.g., aluminum oxide and hafnium oxide), dielectric metal oxynitride, dielectric metal silicates, alloys thereof, and/or combinations thereof. In some embodiments, the tunnel dielectric material 1514 comprises silicon dioxide or silicon oxynitride.

The memory material 1516 may comprise a charge trapping material or a conductive material. The memory material 1516 may be formed of and include one or more of silicon nitride, silicon oxynitride, polysilicon (e.g., doped polysilicon), a conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 1516 comprises silicon nitride.

The dielectric blocking material 1518 may be formed of and include a dielectric material, such as, for example, one or more of an oxide (e.g., silicon dioxide), a nitride (e.g., silicon nitride), an oxynitride (e.g., silicon oxynitride), or another material. In some embodiments, the dielectric blocking material 1518 comprises silicon oxynitride.

In some embodiments, the tunnel dielectric material 1514, the memory material 1516, and the dielectric blocking material 1518 together may form a structure configured to trap a charge, such as, for example, an oxide-nitride-oxide (ONO) structure. In some such embodiments, the tunnel dielectric material 1514 comprises silicon dioxide, the memory material 1516 comprises silicon nitride, and the dielectric blocking material 1518 comprises silicon dioxide.

The dielectric barrier material 1520 may be formed of and include one or more of a metal oxide (e.g., one or more of aluminum oxide, hafnium oxide, zirconium oxide, lanthanum oxide, yttrium oxide, tantalum oxide, gadolinium oxide, niobium oxide, titanium oxide), a dielectric silicide (e.g., aluminum silicide, hafnium silicate, zirconium silicate, lanthanum silicide, yttrium silicide, tantalum silicide), and a dielectric nitride (e.g., aluminum nitride, hafnium nitride, lanthanum nitride, yttrium nitride, tantalum nitride).

In some embodiments of memory cells, such as with the memory cell 1502' of FIG. 15A, the dielectric barrier material 1520 may be horizontally adjacent one of the levels of the other structures 1504 (e.g., one of the conductive structures 906) of one of the tiers 904 of the stack structure 902 (FIG. 10A, FIG. 11A, FIG. 14A). The channel material 1512 may be horizontally interposed between the insulative material 1510 and the tunnel dielectric material 1514; the tunnel dielectric material 1514 may be horizontally interposed between the channel material 1512 and the memory material 1516; the memory material 1516 may be horizontally interposed between the tunnel dielectric material 1514 and the dielectric blocking material 1518; the dielectric blocking material 1518 may be horizontally interposed between the memory material 1516 and the dielectric barrier material 1520; and the dielectric barrier material 1520 may be horizontally interposed between the dielectric blocking material 1518 and the level of other structure 1504 (e.g., the level of the conductive structure 906).

With reference to FIG. 15B, illustrated is a memory cell 1502", in accordance with embodiments of the disclosure, wherein the microelectronic device structure (e.g., the microelectronic device structure 1000 of FIG. 10, the microelectronic device structure 1100 of FIG. 11, and/or the microelectronic device structure 1400 of FIG. 14) has been formed by a replacement gate process. One or more (e.g., all) the memory cells 1502' of FIG. 15A may be replaced with the memory cell 1502" of FIG. 15B. The memory cell 1502" may include multiple conductive materials 1506 (FIG. 15A) within the conductive structures 906 (e.g., within the other structures 1504) of the tiers 904. For example, the conductive structures 906 may include a conductive material 1522 within a conductive liner material 1524. The conductive liner material 1524 may be directly adjacent upper and lower surfaces of the insulative structures 104, and the conductive material 1522 may be directly vertically between portions of the conductive liner material 1524. The conductive liner material 1524 may comprise, for example, a seed material that enables formation of the conductive material 1522, during fabrication of the memory cell 1502". The conductive liner material 1524 may be formed of and include, for example, a metal (e.g., titanium, tantalum), a metal nitride (e.g., tungsten nitride, titanium nitride, tantalum nitride), or another material. In some embodiments, the conductive liner material 1524 comprises titanium nitride, and the conductive material 1522 comprises tungsten.

In other embodiments, the conductive liner material 1524 is not included, and the conductive material 1522 may be directly adjacent to, and in physical contact with, the insulative structures 104, such with the conductive material(s) 1506 of the memory cell 1502' of FIG. 15A, as discussed above.

With reference to FIG. 15C, illustrated in simplified cross-section is a memory cell 1502''', in accordance with additional embodiments of the disclosure. One or more (e.g., all) of the memory cell 1502' of FIG. 15A and/or the memory cell 1502" of FIG. 15B may be replaced with the memory cell 1502''' of FIG. 15C. The memory cell 1502''' may include the insulative material 1510 and the channel material 1512, as described above, and may further include a first dielectric material 1526 (e.g., a tunnel dielectric material) horizontally adjacent the channel material 1512. A second dielectric material 1528 (e.g., a charge trapping material) may be horizontally adjacent the first dielectric material 1526; and a third dielectric material 1530 (e.g., a charge blocking material) may be horizontally adjacent the second dielectric material 1528 and the conductive material 1522. In some embodiments, the first dielectric material 1526 comprises an oxide material (e.g., silicon dioxide), the second dielectric material 1528 comprises a nitride material (e.g., silicon nitride), and the third dielectric material 1530 comprises an oxide material (e.g., silicon dioxide). For clarity, in FIG. 15C, the conductive liner material 1524 (FIG. 15B) is not illustrated around the conductive material 1522; however, in some embodiments, the memory cell 1502''' may further include such conductive liner material 1524.

With reference to FIG. 15D, illustrated in simplified cross-section is a memory cell 1502''', in accordance with additional embodiments of the disclosure, wherein the memory cell 1502''' may be configured as a so-called "floating gate" memory cell. One or more (e.g., all) of the memory cell 1502' of FIG. 15A, the memory cell 1502" of FIG. 15B, and/or the memory cell 1502''' of FIG. 15C may be replaced with the memory cell 1502''' of FIG. 15D. In addition to the insulative material 1510 and the channel material 1512, the memory cell 1502''' may include an electrode structure 1536, which may be referred to as a "floating gate." The electrode structure 1536 may comprise an electrically conductive material, such as, e.g., polysilicon and/or one or more of the materials described with respect to conductive material 1522 (e.g., tungsten). The memory cell 1502''' may further include a dielectric material 1532, which may be referred to as a "gate dielectric" material. The dielectric material 1532 may comprise, for example, one or more of the materials described above with reference to the tunnel dielectric material 1514. In some embodiments, the dielectric material 1532 comprises silicon dioxide. An other dielectric material 1534 may be located around portions of the electrode structure 1536. The other dielectric material 1534 may comprise one or more of the materials described above with reference to the tunnel dielectric material 1514. In some embodiments, the other dielectric material 1534 has the same material composition as the dielectric material 1532. The other dielectric material 1534 may be located between the electrode structure 1536 and the conductive material 1522. For clarity, in FIG. 15D, the conductive liner material 1524 (FIG. 15B) is not illustrated around the conductive material 1522. However, it will be understood that in some embodiments, the memory cell 1502''' may include the conductive liner material 1524.

Accordingly, each of the pillars 602 (FIG. 10, FIG. 11, FIG. 14) may provide a string of memory cells 1502 extending vertically, or at least partially vertically, through the stack structure 902.

Whether the memory cells 1502, and therefore the microelectronic device structures (e.g., the microelectronic device structure 1000 of FIG. 10, the microelectronic device structure 1100 of FIG. 11, and/or the microelectronic device structure 1400 of FIG. 14), are formed with replacement gates (e.g., to form the memory cells 1502' of FIG. 15A, the memory cells 1502" of FIG. 15B, the memory cell 1502''' of FIG. 15C) or with floating gates (e.g., to form the memory cells 1502''' of FIG. 15D), the memory cells 1502 may be located at an intersection of one of the other structures 1504 (e.g., of one of the tiers 904 of the stack structure 902 (FIG. 10, FIG. 11, FIG. 14)) and one of the pillars 602 extending through the stack structure 902 (FIG. 10, FIG. 11, FIG. 14), the pillars 602 including at least the channel material 1512.

Accordingly, disclosed is an electronic device comprising blocks of pillar arrays. The pillar arrays comprise pillars extending vertically through a stack structure. The stack structure comprises insulative structures vertically alternating with conductive structures. The pillars comprise at least one channel material. A series of support pillars is along a region separating neighboring blocks of the blocks of pillar arrays. The support pillars extend vertically through the stack structure. A series of slit structures extends vertically through the stack structure in the region separating the neighboring blocks. Each support pillar, of the series of support pillars, is horizontally interposed between a pair of the slit structures, of the series of slit structures.

Figure 16:
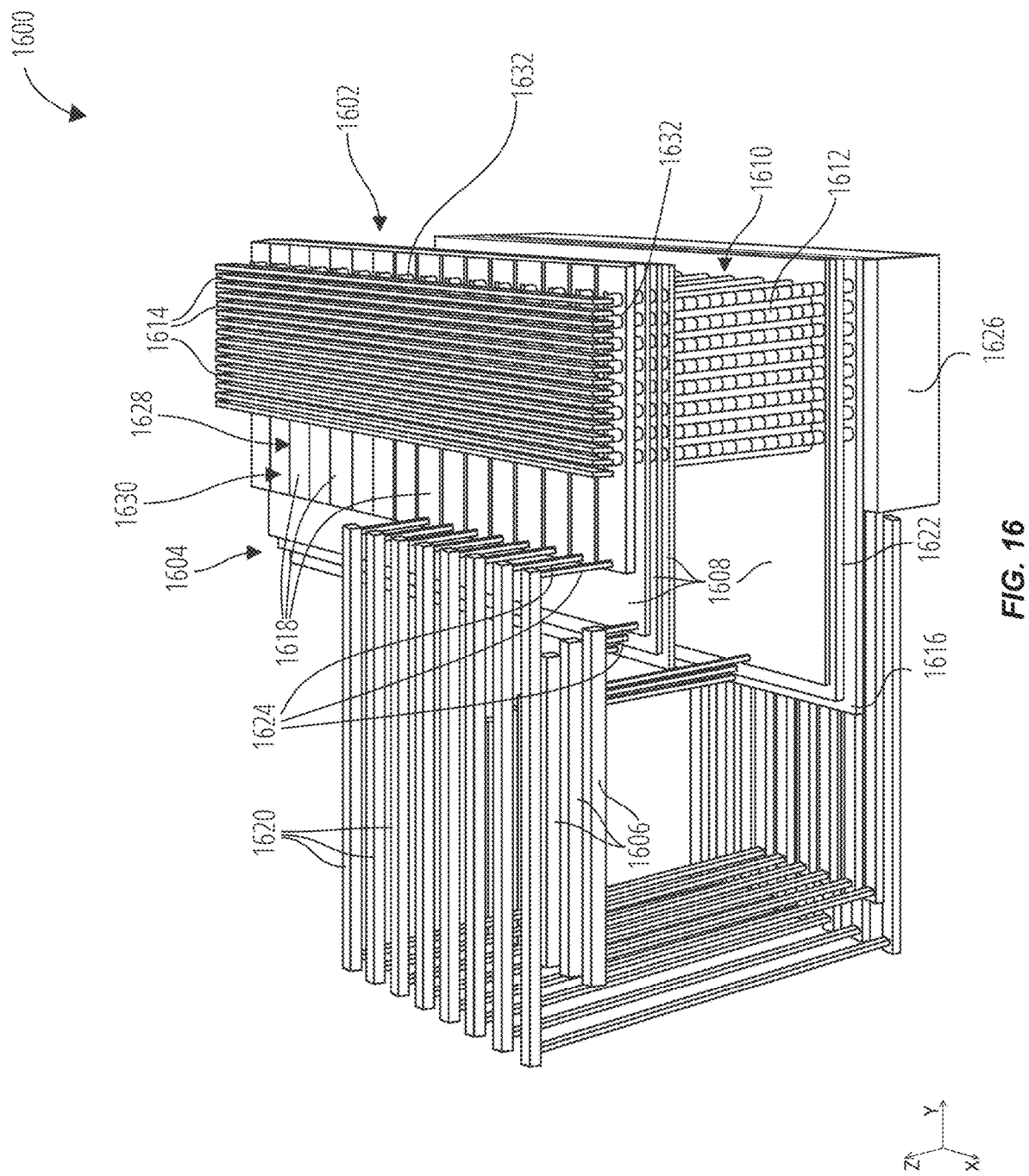
FIG. 16 is a partial, cutaway, perspective, schematic illustration of a microelectronic device, in accordance with embodiments of the disclosure.

With reference to FIG. 16, illustrated is a partial cutaway, perspective, schematic illustration of a portion of a microelectronic device 1600 (e.g., a memory device, such as a 3D NAND Flash memory device) including a microelectronic device structure 1602. The microelectronic device structure 1602 may be substantially similar to, e.g., the microelectronic device structure 1000 of FIG. 10, the microelectronic device structure 1100 of FIG. 11, and/or the microelectronic device structure 1400 of FIG. 14.

As illustrated in FIG. 16, the microelectronic device structure 1602 may include a staircase structure 1604 defining contact regions for connecting access lines 1606 to conductive tiers 1608 (e.g., conductive layers, conductive plates, such as the conductive structures 906 (FIG. 10, FIG. 11, FIG. 14) of the stack structure 902 of FIG. 10, FIG. 11, and/or FIG. 14). The microelectronic device structure 1602 may include pillars 602 (FIG. 10, FIG. 11, FIG. 14) forming strings 1610 of memory cells 1612, such as strings of one or more of the memory cells 1502 previously described with reference to FIG. 15A through FIG. 15D. The pillars 602 forming the strings 1610 of memory cells 1612 may extend at least somewhat vertically (e.g., in the Z-direction) and orthogonally relative to the conductive tiers 1608, relative to data lines 1614, relative to a source tier 1616 (e.g., within the base structure 110 (FIG. 10, FIG. 11, FIG. 14)), relative to access lines 1606, relative to first select gates 1618 (e.g., upper select gates, such as drain select gates (SGDs)), relative to select lines 1620, and/or relative to a second select gate 1622 (e.g., a lower select gate, a source select gate (SGS)).

The first select gates 1618 may be horizontally divided (e.g., in the X-direction) into multiple blocks 1630 (e.g., each block 1630 comprising one of the pillar array regions 118 (FIG. 10, FIG. 11, FIG. 14)) spaced apart (e.g., in the X-axis direction) from one another by slits 1628 (e.g., segments of slits 702 interrupted by inter-slit support pillars 704 along slit region 116 (FIG. 10, FIG. 11, FIG. 14)).

Vertical conductive contacts 1624 may electrically couple components to each other, as illustrated. For example, the select lines 1620 may be electrically coupled to the first select gates 1618, and the access lines 1606 may be electrically coupled to the conductive tiers 1608. The microelectronic device 1600 may also include a control unit 1626 positioned under the memory array, which control unit 1626 may include control logic devices configured to control various operations of other features (e.g., the memory strings 1610, the memory cells 1612) of the microelectronic device 1600. By way of non-limiting example, the control unit 1626 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and/or other chip/deck control circuitry. The control unit 1626 may be electrically coupled to the data lines 1614, the source tier 1616, the access lines 1606, the first select gates 1618, and/or the second select gates 1622, for example. In some embodiments, the control unit 1626 includes CMOS (complementary metal-oxide-semiconductor) circuitry. In such embodiments, the control unit 1626 may be characterized as having a "CMOS under Array" ("CuA") configuration.

The first select gates 1618 may extend horizontally in a first direction (e.g., the Y-axis direction) and may be coupled to respective first groups of strings 1610 of memory cells 1612 at a first end (e.g., an upper end) of the strings 1610. The second select gate 1622 may be formed in a substantially planar configuration and may be coupled to the strings 1610 at a second, opposite end (e.g., a lower end) of the strings 1610 of memory cells 1612.

The data lines 1614 (e.g., bit lines) may extend horizontally in a second direction (e.g., in the X-axis direction) that is at an angle (e.g., perpendicular) to the first direction in which the first select gates 1618 extend. The data lines 1614 may be coupled to respective second groups of the strings 1610 at the first end (e.g., the upper end) of the strings 1610. A first group of strings 1610 coupled to a respective first select gate 1618 may share a particular string 1610 with a second group of strings 1610 coupled to a respective data line 1614. Thus, a particular string 1610 may be selected at an intersection of a particular first select gate 1618 and a particular data line 1614. Accordingly, the first select gates 1618 may be used for selecting memory cells 1612 of the strings 1610 of memory cells 1612.

The conductive tiers 1608 (e.g., word line plates) may extend in respective horizontal planes. The conductive tiers 1608 may be stacked vertically, such that each conductive tier 1608 is coupled to all of the strings 1610 of memory cells 1612, and the strings 1610 of the memory cells 1612 extend vertically through the stack (e.g., stack structure 902 (FIG. 10, FIG. 11, FIG. 14)) of conductive tiers 1608. The conductive tiers 1608 may be coupled to, or may form control gates of, the memory cells 1612 to which the conductive tiers 1608 are coupled. Each conductive tier 1608 may be coupled to one memory cell 1612 of a particular string 1610 of memory cells 1612.

The first select gates 1618 and the second select gates 1622 may operate to select a particular string 1610 of the memory cells 1612 between a particular data line 1614 and the source tier 1616. Thus, a particular memory cell 1612 may be selected and electrically coupled to a data line 1614 by operation of (e.g., by selecting) the appropriate first select gate 1618, second select gate 1622, and conductive tier 1608 that are coupled to the particular memory cell 1612.

The staircase structure 1604 may be configured to provide electrical connection between the access lines 1606 and the conductive tiers 1608 through the vertical conductive contacts 1624. In other words, a particular level of the conductive tiers 1608 may be selected via one of the access lines 1606 that is in electrical communication with a respective one of the conductive contacts 1624 in electrical communication with the particular conductive tier 1608.

The data lines 1614 may be electrically coupled to the strings 1610 of memory cells 1612 through conductive structures 1632.

Figure 17:
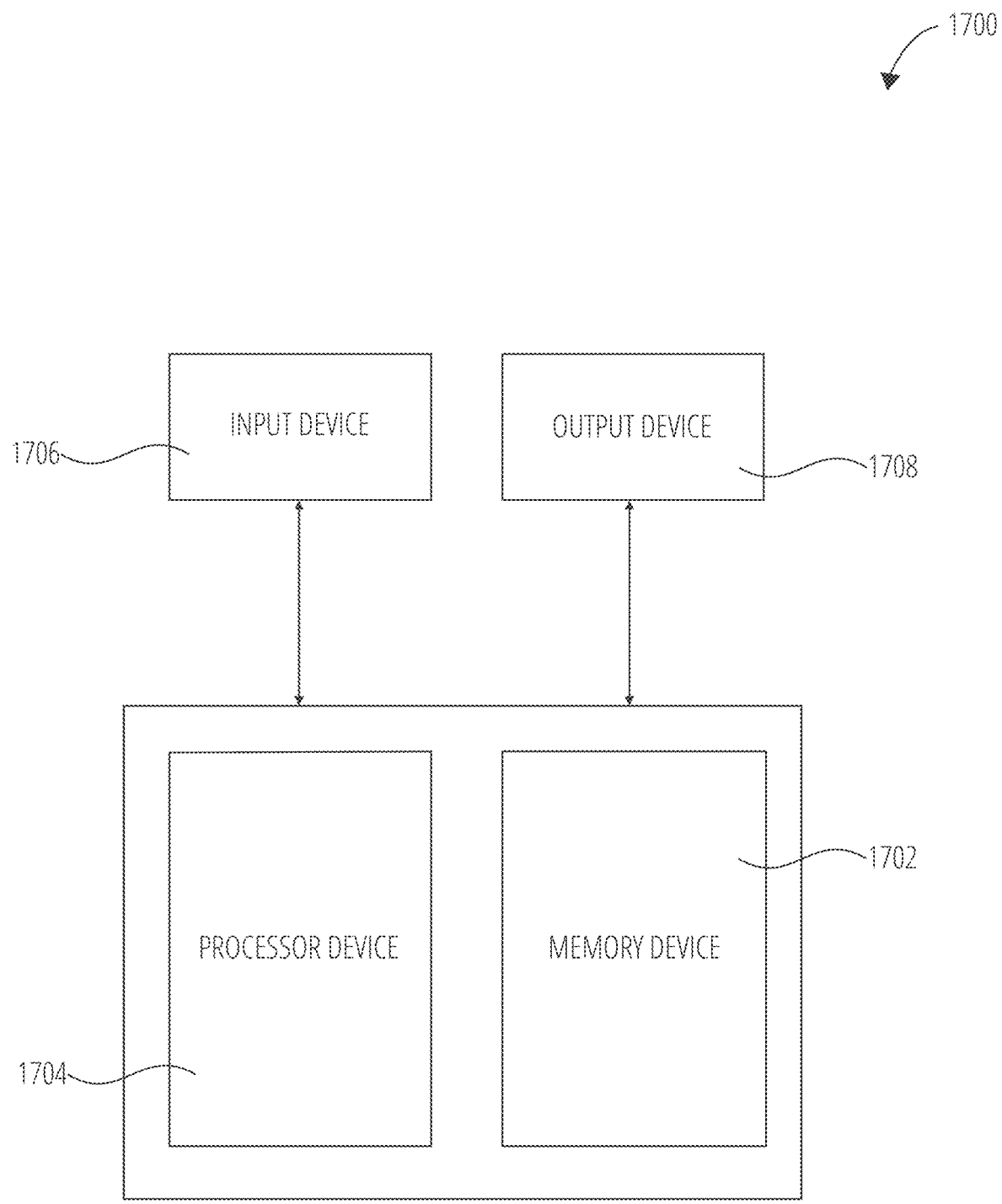
FIG. 17 is a block diagram of an electronic system, in accordance with embodiments of the disclosure.

Microelectronic devices (e.g., the microelectronic device 1600) including microelectronic device structures (e.g., the microelectronic device structure 1000 of FIG. 10, the microelectronic device structure 1100 of FIG. 11, and/or the microelectronic device structure 1400 of FIG. 14) may be used in embodiments of electronic systems of the disclosure. For example, FIG. 17 is a block diagram of an electronic system 1700, in accordance with embodiments of the disclosure. The electronic system 1700 may comprise, for example, a computer or computer hardware component, a server or other networking hardware component, a cellular telephone, a digital camera, a personal digital assistant (PDA), a portable media (e.g., music) player, a Wi-Fi or cellular-enabled tablet (e.g., an iPAD® or SURFACE® tablet, an electronic book, a navigation device), etc. The electronic system 1700 includes at least one memory device 1702. The memory device 1702 may include, for example, one or more embodiment of a microelectronic device and/or structure previously described herein (e.g., the microelectronic device 1600 of FIG. 16, the microelectronic device structure 1000 of FIG. 10, the microelectronic device structure 1100 of FIG. 11, and/or the microelectronic device structure 1400 of FIG. 14), e.g., with structures formed according to embodiments previously described herein.

The electronic system 1700 may further include at least one electronic signal processor device 1704 (often referred to as a "microprocessor"). The processor device 1704 may, optionally, include an embodiment of a microelectronic device and/or a microelectronic device structure previously described herein (e.g., the microelectronic device 1600 of FIG. 16, the microelectronic device structure 1000 of FIG. 10, the microelectronic device structure 1100 of FIG. 11, and/or the microelectronic device structure 1400 of FIG. 14). The electronic system 1700 may further include one or more input devices 1706 for inputting information into the electronic system 1700 by a user, such as, for example, a mouse or other pointing device, a keyboard, a touchpad, a button, or a control panel. The electronic system 1700 may further include one or more output devices 1708 for outputting information (e.g., visual or audio output) to a user such as, for example, a monitor, a display, a printer, an audio output jack, a speaker, etc. In some embodiments, the input device 1706 and the output device 1708 may comprise a single touchscreen device that can be used both to input information into the electronic system 1700 and to output visual information to a user. The input device 1706 and the output device 1708 may communicate electrically with one or more of the memory device 1702 and the electronic signal processor device 1704.

Accordingly, disclosed is an electronic system comprising an input device, an output device, a processor device, and a memory device. The processor device is operably coupled to the input device and to the output device. The memory device is operably coupled to the processor device and comprises at least one microelectronic device structure. The at least one microelectronic device structure comprises pillar array blocks laterally separated from one another by a region. The region comprises a series of insulative support pillars longitudinally alternating with a series of slit structures. The pillar array blocks comprise pillars extending vertically through a stack structure. The stack structure comprises insulative structures vertically interleaved with conductive structures. The pillars comprise at least one channel material. The insulative support pillars and the slit structures each extend vertically through the stack structure in the region separating the pillar array blocks.

Figure 18:
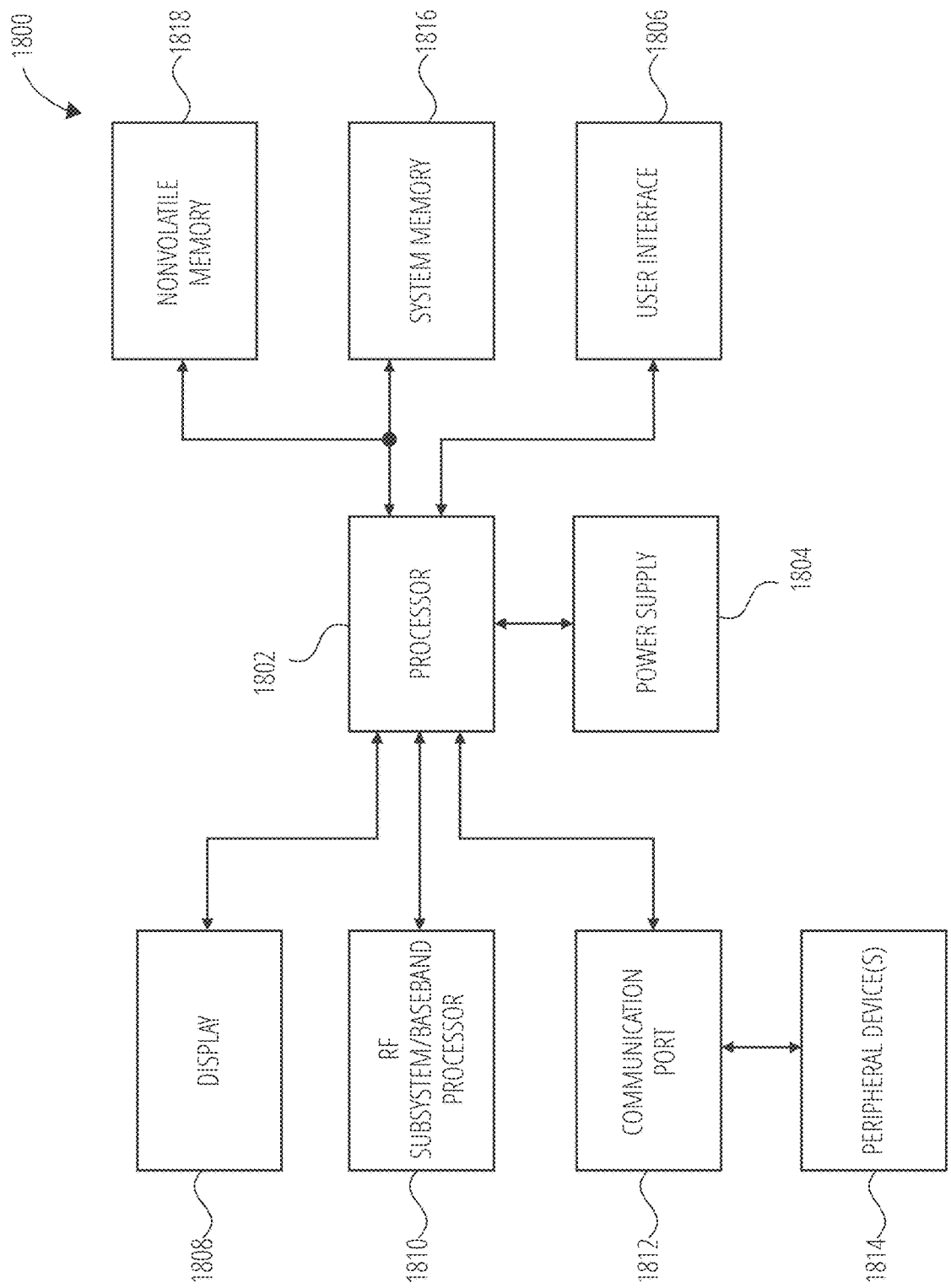
FIG. 18 is a block diagram of a processor-based system, in accordance with embodiments of the disclosure.

With reference to FIG. 18, shown is a block diagram of a processor-based system 1800. The processor-based system 1800 may include various microelectronic devices (e.g., the microelectronic device 1600 of FIG. 16) and microelectronic device structures (e.g., the microelectronic device structure 1000 of FIG. 10, the microelectronic device structure 1100 of FIG. 11, and/or the microelectronic device structure 1400 of FIG. 14) manufactured in accordance with embodiments of the present disclosure. The processor-based system 1800 may be any of a variety of types, such as a computer, a pager, a cellular phone, a personal organizer, a control circuit, or another electronic device. The processor-based system 1800 may include one or more processors 1802, such as a microprocessor, to control the processing of system functions and requests in the processor-based system 1800. The processor 1802 and other subcomponents of the processor-based system 1800 may include microelectronic devices (e.g., the microelectronic device 1600 of FIG. 16) and microelectronic device structures (e.g., the microelectronic device structure 1000 of FIG. 10, the microelectronic device structure 1100 of FIG. 11, and/or the microelectronic device structure 1400 of FIG. 14) manufactured in accordance with embodiments of the present disclosure.

The processor-based system 1800 may include a power supply 1804 in operable communication with the processor 1802. For example, if the processor-based system 1800 is a portable system, the power supply 1804 may include one or more of a fuel cell, a power scavenging device, permanent batteries, replaceable batteries, and/or rechargeable batteries. The power supply 1804 may also include an AC adapter; therefore, the processor-based system 1800 may be plugged into a wall outlet, for example. The power supply 1804 may also include a DC adapter such that the processor-based system 1800 may be plugged into a vehicle cigarette lighter or a vehicle power port, for example.

Various other devices may be coupled to the processor 1802 depending on the functions that the processor-based system 1800 performs. For example, a user interface 1806 may be coupled to the processor 1802. The user interface 1806 may include one or more input devices, such as buttons, switches, a keyboard, a light pen, a mouse, a digitizer and stylus, a touch screen, a voice recognition system, a microphone, or a combination thereof. A display 1808 may also be coupled to the processor 1802. The display 1808 may include an LCD display, an SED display, a CRT display, a DLP display, a plasma display, an OLED display, an LED display, a three-dimensional projection, an audio display, or a combination thereof. Furthermore, an RF subsystem/baseband processor 1810 may also be coupled to the processor 1802. The RF subsystem/baseband processor 1810 may include an antenna that is coupled to an RF receiver and to an RF transmitter. A communication port 1812, or more than one communication port 1812, may also be coupled to the processor 1802. The communication port 1812 may be adapted to be coupled to one or more peripheral devices 1814 (e.g., a modem, a printer, a computer, a scanner, a camera) and/or to a network (e.g., a local area network (LAN), a remote area network, an intranet, or the Internet).

The processor 1802 may control the processor-based system 1800 by implementing software programs stored in the memory (e.g., system memory 1816). The software programs may include an operating system, database software, drafting software, word processing software, media editing software, and/or media-playing software, for example. The memory (e.g., the system memory 1816) is operably coupled to the processor 1802 to store and facilitate execution of various programs. For example, the processor 1802 may be coupled to system memory 1816, which may include one or more of spin torque transfer magnetic random access memory (STT-MRAM), magnetic random access memory (MRAM), dynamic random access memory (DRAM), static random access memory (SRAM), racetrack memory, and/or other known memory types. The system memory 1816 may include volatile memory, nonvolatile memory, or a combination thereof. The system memory 1816 is typically large so it can store dynamically loaded applications and data. In some embodiments, the system memory 1816 may include semiconductor devices (e.g., the microelectronic device 1600 of FIG. 16) and structures (e.g., the microelectronic device structure 1000 of FIG. 10, the microelectronic device structure 1100 of FIG. 11, and/or the microelectronic device structure 1400 of FIG. 14) described above, or a combination thereof.

The processor 1802 may also be coupled to nonvolatile memory 1818, which is not to suggest that system memory 1816 is necessarily volatile. The nonvolatile memory 1818 may include one or more of STT-MRAM, MRAM, read-only memory (ROM) (e.g., EPROM, resistive read-only memory (RROM)), and Flash memory to be used in conjunction with the system memory 1816. The size of the nonvolatile memory 1818 is typically selected to be just large enough to store any necessary operating system, application programs, and fixed data. Additionally, the nonvolatile memory 1818 may include a high-capacity memory (e.g., disk drive memory, such as a hybrid-drive including resistive memory or other types of nonvolatile solid-state memory, for example). The nonvolatile memory 1818 may include microelectronic devices (e.g., the microelectronic device 1600 of FIG. 16) and structures (e.g., the microelectronic device structure 1000 of FIG. 10, the microelectronic device structure 1100 of FIG. 11, and/or the microelectronic device structure 1400 of FIG. 14) described above, or a combination thereof.

While the disclosed structures, apparatus (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
   a stack structure comprising a vertically alternating sequence of insulative structures and conductive structures arranged in tiers;
   at least one slit region dividing the stack structure into blocks, each block comprising an array of active pillars; and
   along the at least one slit region, a horizontally alternating sequence of slit structure segments and support pillar structures, the slit structure segments and the support pillar structures each extending vertically through the stack structure,
   wherein, laterally adjacent the support pillar structures, the conductive structures of the stack structure are laterally recessed relative to the insulative structures of the stack structure.

2. The microelectronic device of claim 1, wherein, for each level of the insulative structures of the stack structure, at least one portion extends laterally across the at least one slit region between a pair of the blocks.

3. The microelectronic device of claim 1, wherein a maximum width of the support pillar structures is less than or equal to a maximum width of the slit structure segments.

4. The microelectronic device of claim 1, wherein the support pillar structures extend to a lower depth within the microelectronic device, than a depth to which the slit structure segments extend.

5. The microelectronic device of claim 1, wherein the slit structure segments include a seam.

6. The microelectronic device of claim 1, wherein, at a level of the stack structure, a cross-sectional area of one of the support pillar structures is greater than a cross-sectional area of one of the active pillars of the array of active pillars.

7. The microelectronic device of claim 1, wherein:
   the pillars of the array of active pillars have circular cross-sectional areas; and
   the support pillar structures have cross-sectional areas other than circular cross-sectional areas.

8. The microelectronic device of claim 7, wherein the support pillar structures have oblong cross-sectional areas.

9. The microelectronic device of claim 1, wherein sidewalls of the support pillar structures taper through elevations of the stack structure.

10. A microelectronic device, comprising:
    a stack structure comprising a vertically alternating sequence of insulative structures and conductive structures arranged in tiers;
    at least one slit region dividing the stack structure into blocks, each block comprising an array of active pillars; and
    along the at least one slit region, a horizontally alternating sequence of slit structure segments and support pillar structures, the slit structure segments and the support pillar structures each extending vertically through the stack structure,
    wherein none of the insulative structures of the stack structure extend laterally across the at least one slit region between a pair of the blocks.

11. A microelectronic device, comprising:
    blocks of pillar arrays comprising pillars extending vertically through a stack structure, the stack structure comprising insulative structures vertically alternating with conductive structures, the pillars comprising at least one channel material;
    a series of support pillars along a region separating neighboring blocks of the blocks of pillar arrays, the support pillars extending vertically through the stack structure; and
    a series of slit structures extending vertically through the stack structure in the region separating the neighboring blocks,
    each support pillar, of the series of support pillars, being horizontally interposed between a pair of the slit structures, of the series of slit structures,
    wherein each of the insulative structures, of the stack structure, comprises at least one portion spanning laterally across the region, and
    wherein none of the conductive structures, of the stack structure, span across the region.

12. The microelectronic device of claim 11, further comprising portions of the insulative structures spanning across the region, from one of the neighboring blocks to another of the neighboring blocks.

13. An electronic system, comprising:
    an input device;
    an output device;
    a processor device operably coupled to the input device and to the output device; and
    a memory device operably coupled to the processor device and comprising at least one microelectronic device structure, the at least one microelectronic device structure comprising:
    pillar array blocks laterally separated from one another by a region, the region comprising a series of insulative support pillars longitudinally alternating with a series of slit structures,
    the pillar array blocks comprising pillars extending vertically through a stack structure, the stack structure comprising insulative structures vertically interleaved with conductive structures, the pillars comprising at least one channel material, the insulative support pillars and the slit structures each extending vertically through the stack structure in the region separating the pillar array blocks, wherein, laterally adjacent the insulative support pillars, the conductive structures of the stack structure are laterally recessed relative to the insulative structures of the stack structure.

* * * * *

UNITED STATES PATENT AND TRADEMARK OFFICE
CERTIFICATE OF CORRECTION

PATENT NO. : 11,723,196 B2
APPLICATION NO. : 17/063101
DATED : August 8, 2023
INVENTOR(S) : Anilkumar Chandolu and Indra V. Chary It is certified that error appears in the above-identified patent and that said Letters Patent is hereby corrected as shown below:

In the Specification

| | | |
|---|---|---|
| Column 6, | Line 57, | change "X"neighboring" a" to --$X$ "neighboring" a-- |
| Column 6, | Line 63, | change ""consistent"-when" to --"consistent"—when-- |
| Column 7, | Line 1, | change "feature-means" to --feature—means-- |
| Column 15, | Line 65, | change "or more of" to --or more of:-- |
| Column 19, | Line 65, | change "through FIG. 11C. FIG. 11C). In" to --through FIG. 11C. In-- |
| Column 20, | Line 65, | change "**1502′′′** of FIG." to --**1502′′′′** of FIG.-- |
| Column 21, | Line 12, | change "cell **1502′′′** of FIG." to --cell **1502′′′′** of FIG.-- |
| Column 24, | Line 2, | change "cell **1502′′′**, in" to --cell **1502′′′′**, in-- |
| Column 24, | Line 4, | change "cell **1502′′′** may" to --cell **1502′′′′** may-- |
| Column 24, | Line 8, | change "cell **1502′′′** of FIG." to --cell **1502′′′′** of FIG.-- |
| Column 24, | Line 10, | change "cell **1502′′′** may" to --cell **1502′′′′** may-- |
| Column 24, | Line 15, | change "cell **1502′′′** may" to --cell **1502′′′′** may-- |
| Column 24, | Line 33, | change "cell **1502′′′** may" to --cell **1502′′′′** may-- |
| Column 24, | Line 47, | change "cells **1502′′′** of FIG." to --cells **1502′′′′** of FIG.-- |

Signed and Sealed this
Thirtieth Day of January, 2024

*Katherine Kelly Vidal*
Katherine Kelly Vidal
*Director of the United States Patent and Trademark Office*